United States Patent
Singh et al.

(12) 
(10) Patent No.: US 9,960,771 B2
(45) Date of Patent: May 1, 2018

(54) HUM GENERATION USING REPRESENTATIVE CIRCUITRY

(71) Applicant: Wave Computing, Inc., Campbell, CA (US)

(72) Inventors: Gajendra Prasad Singh, Sunnyvale, CA (US); Shaishav Desai, San Jose, CA (US)

(73) Assignee: Wave Computing, Inc., Campbell, CA (US)

( * ) Notice: Subject to any disclaimer, the term of this patent is extended or adjusted under 35 U.S.C. 154(b) by 0 days. days.

(21) Appl. No.: 15/475,411

(22) Filed: Mar. 31, 2017

(65) Prior Publication Data

US 2017/0288674 A1    Oct. 5, 2017

Related U.S. Application Data

(60) Provisional application No. 62/315,779, filed on Mar. 31, 2016.

(51) Int. Cl.
*H03K 19/096* (2006.01)
*H03K 19/20* (2006.01)
*H03K 5/135* (2006.01)

(52) U.S. Cl.
CPC .......... *H03K 19/096* (2013.01); *H03K 5/135* (2013.01); *H03K 19/20* (2013.01)

(58) Field of Classification Search
CPC ......... G06F 1/10; G06F 1/12; H03K 19/0016; H03K 19/0096; H03K 19/00963; H03K 19/0966; H03K 19/20; H03K 19/23; H03K 5/13; H03K 5/135; G01R 19/0038
See application file for complete search history.

(56) References Cited

U.S. PATENT DOCUMENTS

| | | |
|---|---|---|
| 5,305,463 A | 4/1994 | Fant et al. |
| 5,331,669 A * | 7/1994 | Wang ............... H03K 5/135 327/141 |
| 5,355,496 A | 10/1994 | Fant et al. |
| 5,572,732 A | 11/1996 | Fant et al. |
| 5,640,105 A | 6/1997 | Sobelman et al. |
| 5,652,902 A | 7/1997 | Fant |
| 5,656,948 A | 8/1997 | Sobelman et al. |
| 5,664,211 A | 9/1997 | Sobelman et al. |
| 5,664,212 A | 9/1997 | Fant et al. |
| 5,764,081 A | 6/1998 | Fant et al. |

(Continued)

OTHER PUBLICATIONS

"Glitch-Free Design for Multi-Threshold CMOS NCL Circuits", by Al Zahrani, et al., GLIVLSI'09, May 10-12, 2009, Boston, Massachusetts, Copyright 2009 ACM 978-1-60558-522-2/09/05.

*Primary Examiner* — Jason M Crawford
(74) *Attorney, Agent, or Firm* — Adams Intellex, PLC

(57) ABSTRACT

Disclosed embodiments select a proper hum frequency reference by utilizing one or more functional logic circuits within a cluster. The slowest logic circuit is determined, and an instance of that logic circuit is used in timing circuitry for the cluster. Multiple logic circuits with similar characteristics are incorporated into the timing circuit. Each cluster is interconnected to a second level timing circuit. Each cluster inputs timing information into the second level timing circuit. The second level timing circuit then determines when the next cycle, or tic, of the self-generated clock starts, and the process repeats, providing a self-generated clock signal.

19 Claims, 15 Drawing Sheets

(56) References Cited

U.S. PATENT DOCUMENTS

| | | | |
|---|---|---|---|
| 5,793,662 A | 8/1998 | Duncan et al. | |
| 5,796,962 A | 8/1998 | Fant et al. | |
| 5,805,461 A | 9/1998 | Fant et al. | |
| 5,828,228 A | 10/1998 | Fant et al. | |
| 5,896,541 A | 4/1999 | Fant et al. | |
| 5,907,693 A | 5/1999 | Fant et al. | |
| 5,930,522 A | 7/1999 | Fant | |
| 5,977,663 A | 11/1999 | Fant et al. | |
| 5,986,466 A | 11/1999 | Sobelman et al. | |
| 6,020,754 A | 2/2000 | Sobelman et al. | |
| 6,031,390 A | 2/2000 | Fant et al. | |
| 6,043,674 A | 3/2000 | Sobelman | |
| 6,052,770 A | 4/2000 | Fant | |
| 6,128,678 A | 10/2000 | Masteller | |
| 6,262,593 B1 | 7/2001 | Sobelman et al. | |
| 6,275,841 B1 | 8/2001 | Potter et al. | |
| 6,308,229 B1 | 10/2001 | Masteller | |
| 6,313,660 B1 | 11/2001 | Sobelman et al. | |
| 6,327,607 B1 | 12/2001 | Fant | |
| 6,333,640 B1 | 12/2001 | Fant et al. | |
| 6,526,542 B2 | 2/2003 | Kondratyev | |
| 6,738,442 B1 * | 5/2004 | Wilcox | H03K 5/135 327/142 |
| 6,771,099 B2 * | 8/2004 | Cavazos | H03K 3/0375 327/141 |
| 6,900,658 B1 | 5/2005 | Sobelman et al. | |
| 7,015,765 B2 | 3/2006 | Shepard et al. | |
| 7,053,662 B1 | 5/2006 | Silver et al. | |
| 7,145,408 B2 | 12/2006 | Shepard et al. | |
| 7,478,222 B2 | 1/2009 | Fant | |
| 7,571,410 B2 | 8/2009 | Restle | |
| 7,870,516 B2 | 1/2011 | Sotiriou et al. | |
| 7,930,517 B2 | 4/2011 | Fant | |
| 7,977,972 B2 | 7/2011 | Di et al. | |
| 8,020,145 B2 | 9/2011 | Fant | |
| 8,026,741 B2 | 9/2011 | Takayanagi | |
| 8,078,839 B2 | 12/2011 | Fant | |
| 8,086,975 B2 | 12/2011 | Shiring et al. | |
| 8,934,491 B2 | 1/2015 | Lee et al. | |
| 8,937,935 B2 | 1/2015 | Yuan et al. | |
| 8,937,963 B1 | 1/2015 | Narasimha et al. | |
| 8,938,043 B2 | 1/2015 | Bae et al. | |
| 8,952,727 B2 | 2/2015 | Johnston et al. | |
| 9,568,944 B2 * | 2/2017 | Worrell | G06F 1/12 |
| 2004/0135601 A1 * | 7/2004 | Aman | H03K 3/0315 327/116 |
| 2005/0231244 A1 * | 10/2005 | Hartfiel | G06F 1/12 327/141 |
| 2006/0139112 A1 | 6/2006 | Shepard et al. | |
| 2006/0233006 A1 | 10/2006 | Fant | |
| 2009/0204788 A1 | 8/2009 | Fant | |
| 2014/0049288 A1 * | 2/2014 | Johnston | H03K 19/096 326/93 |
| 2014/0167825 A1 * | 6/2014 | Dobbs | G06F 1/12 327/158 |
| 2015/0015313 A1 | 1/2015 | Waltari et al. | |
| 2015/0016827 A1 | 1/2015 | Wilkinson et al. | |
| 2015/0070049 A1 * | 3/2015 | Laurent | H03K 19/0016 326/93 |
| 2017/0364473 A1 * | 12/2017 | Singh | G06F 15/17325 |

* cited by examiner

HUM GENERATION USING REPRESENTATIVE CIRCUITRY

RELATED APPLICATIONS

This application claims the benefit of U.S. provisional patent application "Hum Generation Using Representative Circuitry" Ser. No. 62/315,779, filed Mar. 31, 2016. The foregoing application is hereby incorporated by reference in its entirety.

FIELD OF ART

This application relates generally to logic circuitry and more particularly to hum generation using representative circuitry.

BACKGROUND

Integrated circuits (ICs) have seen continuous technological advancement, resulting in chips that increasingly perform more logic operations per unit area and at higher operating speeds. The increased capability of integrated circuits has also created more complexity regarding the relationship of various clock or control signals. For example, in a high-speed environment, it may be required that a second clock signal is delayed a certain amount relative to a first clock signal so that data gated by the first clock signal is in an appropriate state on the triggering edge of the second clock signal.

In complex integrated circuits, there may be multiple functional blocks or modules within the integrated circuit that communicate with each other. It is therefore necessary to synchronize the timing of signal transmission and receipt between modules in order to avoid timing errors. Timing errors can cause one or more components to fail to accurately interpret electronic signals as correct data. Many phenomena (physical conditions, digital logic errors, etc.) can result in timing errors, particularly in systems that operate at high speeds and/or have high data throughput rates. Typically, many IC components contain timing circuitry and logic devoted to minimizing timing errors. However, it is always desirable to minimize the physical chip area and the power consumed by IC components, especially by that which is consumed by functions not directly related to the purpose of the system or component.

Some of the electronic components within an IC must be synchronized with other electronic components in the circuit in order to ensure that both sets of electronic components receive the correct data signals at the right time. Failing to synchronize them can yield unreliable or erroneous results. Thus, the rising and/or falling edges of the clock signals must trigger these electronic components at precisely the right time to synchronize their function. To accomplish this crucial requirement, a significant part of the design process for the IC involves analyzing the clock signal paths and the components in these paths to determine the arrival time of rising and/or falling edges of the clock signals at the various synchronized electronic components.

As an example of the importance of reliable timing, microprocessor circuits use clock pulses to synchronize the operations of the microprocessor. Clock pulses can be asynchronous; that is, not synchronized with respect to the clock pulses of other circuits within a complex chip. As a consequence of asynchronous timing, it is possible for the microprocessor to request the data from another circuit while that circuit is not in a stable state. Such a request can cause the microprocessor to receive erroneous data. Similar types of problems can result with other asynchronous real-time data manipulation circuits.

During the design process, various circuit elements must be considered. These include buffering, component placement, and transistor technology, among others. Without proper timing, large scale integrated circuits will not function properly. The operation of highly complex and densely integrated circuits (chips) is typically orchestrated by a system clock signal. The clock signal may take many forms. Regardless of the form, however, the role of the clock signal is to synchronize operations across the entire chip, ensuring that all portions of the chip work together properly. Furthermore, as a result of the ubiquitous nature of the clock signal, this signal must be distributed to virtually every circuit across the entire chip. Clock signals are thus a critical part of most any integrated circuit design.

SUMMARY

Disclosed embodiments utilize a circuit that uses multiple modules or clusters arranged in a mesh to provide a self-clocking circuit. A self-clocked timing signal is generated based on the timing characteristics of representative circuits within clusters. The timing of the multiple clusters is coordinated with a second level timing circuit. One or more representative circuits are used for generating first level timing signals within each cluster. The first level signals are input to the second level timing circuit. The second level timing circuit determines when the corresponding clusters start the next tic of the self-clocked signal. An apparatus for signal generation is disclosed comprising: a first plurality of representative logic circuits; a first edge aligner combining results from the first plurality of representative logic circuits; a first enablement circuit that enables the first plurality of representative logic circuits; a first synchronization signal derived from the results from the first plurality of representative logic circuits; a second plurality of representative logic circuits; a second edge aligner combining results from the second plurality of representative logic circuits; a second enablement circuit that enables the second plurality of representative logic circuits; a second synchronization signal derived from the results from the second plurality of representative logic circuits; and a combined synchronization signal derived from the first synchronization signal and the second synchronization signal.

Various features, aspects, and advantages of various embodiments will become more apparent from the following further description.

BRIEF DESCRIPTION OF THE DRAWINGS

The following detailed description of certain embodiments may be understood by reference to the following figures wherein.

DETAILED DESCRIPTION

Figure 1:
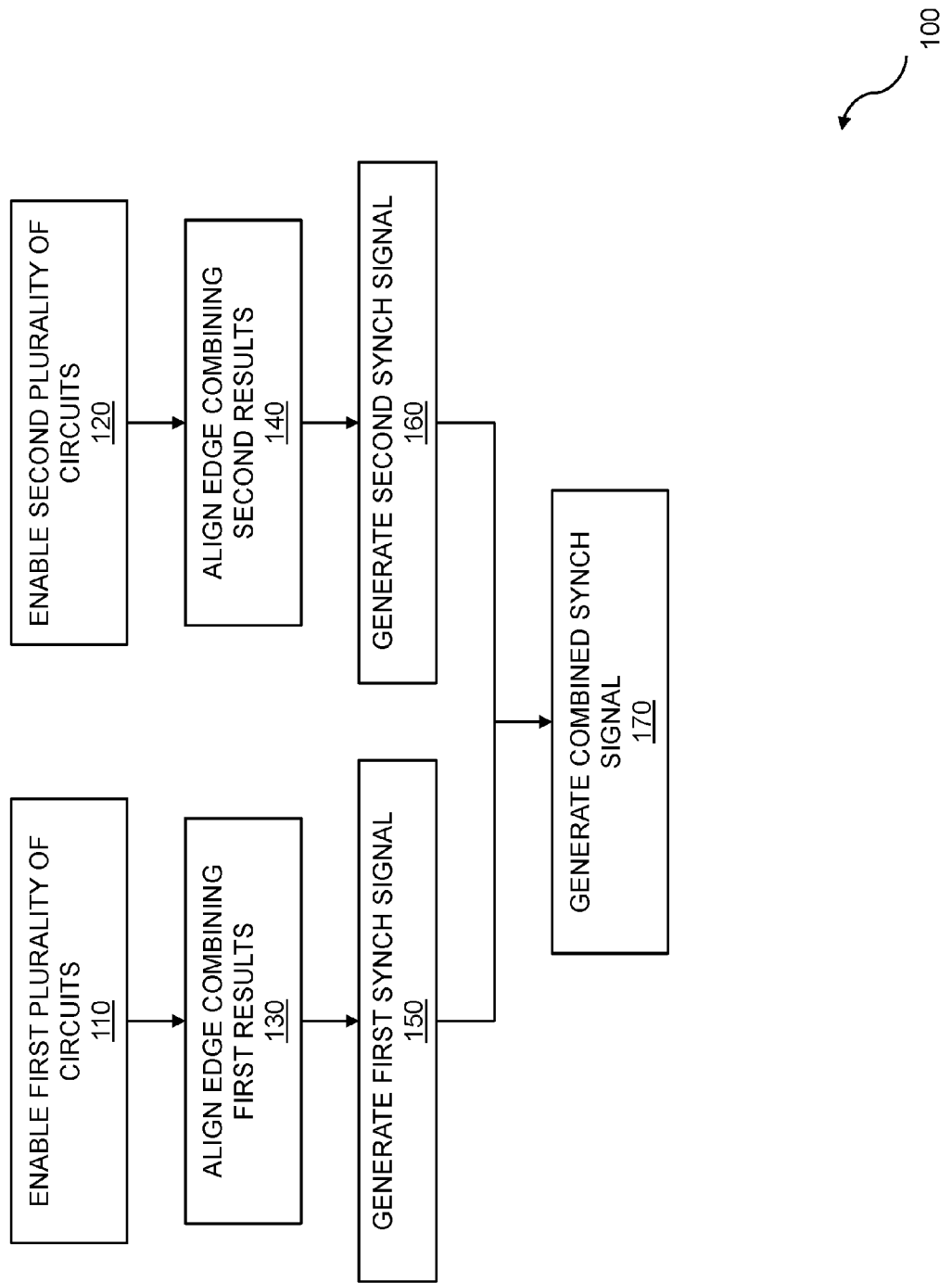
FIG. 1 is a flow diagram for hum signal generation.

Clock signals are a critical part of integrated circuit design. In many legacy systems, a master clock of a fixed frequency is used to time signal dispersion across a chip. However, the associated circuitry for propagating the master clock signal itself or a signal based on the master clock, can impose considerable constraints on an integrated circuit design. One such constraint is power consumption, as the associated circuitry for propagating a clock signal to all parts of the chip can consume considerable power. Another constraint is that of chip real estate. The associated circuitry can take up valuable chip area that could otherwise be used for functional purposes.

Disclosed embodiments utilize a circuit that uses multiple modules or clusters arranged in a mesh to provide a self-clocking circuit. Such a configuration enables considerable savings in power consumption and chip real estate. The circuit is configured to provide hum generation such that the circuit can operate at a hum frequency. A hum frequency can be a frequency at which multiple clusters within the circuit self-synchronize to each other. The hum generation circuit can be referred to as a fabric. The hum generation fabric can form a clock generation structure.

Each module contains one or more functional circuits such as adders, shifters, comparators, and/or flip flops, among others. These functional circuits each perform a function over a finite period of time. The operating frequency of a module is bounded by the slowest functional circuit within the module. In embodiments, each functional circuit operates over one cycle or tic of the clock. With a self-clocking design, it can be a challenge to select a hum frequency that is compatible with each of the various functional logic circuits within each cluster. If the hum frequency is not correct, then the overall operation of the integrated circuit might be compromised.

Disclosed embodiments select a proper hum frequency reference by utilizing one or more functional logic circuits within each cluster. In embodiments, the slowest logic circuit is determined, and an instance of that logic circuit is used in timing circuitry of the cluster. The determining of the slowest logic circuit can be performed using circuit simulation software such as Spice™, or other suitable software. Once the slowest logic circuit is determined, an instance of that circuit is incorporated into a timing circuit within the cluster. Each cluster is interconnected to a second level timing circuit. Each cluster inputs timing information into the second level timing circuit. The second level timing circuit then determines when the next cycle or tic of the self-generated clock will start, and the process repeats. The process of using simulation to determine the slowest functional circuit works well under certain conditions. However, depending on the circuit design, there can be situations where multiple circuits have simulation times that are very close to each other. In such a case, it can be difficult to determine with sufficient probability which functional circuit is the slowest. The actual speed of a functional circuit can depend on many factors that are not easily incorporated into a simulation. These factors include semiconductor processing issues, which can affect important parameters such as threshold voltages (Vt). If Vt shifts, it can affect the timing of a circuit. Such factors also include process variation. That is, manufactured parts can vary from batch to batch, and even within the same batch. Sometimes the variation in the manufacturing process can cause changes in the timing of functional circuits. Furthermore, ambient conditions such as temperature and humidity can affect Vt and thus can also impact the timing of a functional circuit. Thus, under some conditions, a first functional circuit might be the slowest, while under other conditions, a second functional circuit might be the slowest. This variance can create a challenge in deriving an appropriate hum frequency.

Disclosed embodiments handle the uncertainty in functional circuit timing by incorporating multiple functional circuits in the timing circuit of each cluster. For example, if three functional circuits have a fairly close completion time, then instances of each of those three circuits can be incorporated into the timing circuit of the cluster. When the slowest of the three functional circuits completes, that cluster generates a timing signal to the adjacent second level timing circuit. In this manner, the slowest circuit can be dynamically determined during the course of operation. Disclosed embodiments accommodate this change seamlessly, such that if the slowest circuit changes due to operating temperatures or other factors, the self-generated clock dynamically adapts to this change, resulting in reliable hum frequency generation. The resulting capabilities enable the creation of circuits with multiple, diverse clusters with different logic functionality that can be configured to self-generate a reliable clock signal under a variety of operating conditions.

FIG. 1 is a flow diagram for hum signal generation. The flow 100 comprises an apparatus for signal generation. The flow 100 includes enabling a first plurality of representative logic circuits 110. The representative logic circuits can be instances of functional circuits within a module or cluster that is used for logical computation. The functional logic circuits can include, but are not limited to, adders (such as ripple-carry adders), shifters (such as logical shifters, arithmetic shifters), and flip flops. During a circuit design, a plurality of these functional circuits is replicated in a timing circuit within a cluster as a representative plurality of circuits. The representative plurality of circuits can provide a variety of circuit types for timing analysis. The first plurality of representative logic circuits can include a comparator circuit. The first plurality of representative logic circuits can include an adder circuit. The adder circuit can include a ripple-carry adder. The first plurality of representative logic circuits can include a bit manipulation unit. In embodiments, the bit manipulation unit includes an inverter. The first plurality of representative logic circuits can include a programmable logic reduction circuit. The logic reduction circuit can include reconfigurable logic, field programmable logic, or one-time programmable (OTP) logic.

The first plurality of representative logic circuits can include a sequential circuit. A sequential circuit is a circuit that requires multiple tics to complete. The sequential circuit can include a flip flop. In some embodiments, the circuit includes a J-K flip flop. In other embodiments, the circuit includes a D flip flop. Furthermore, the first plurality of representative logic circuits can include a shifter circuit. The shifter circuit can include a logical shifter. The shifter circuit can include an arithmetic shifter. The shifter circuit can include a circular shifter.

The output of the representative circuits is then fed to an edge aligner. The flow 100 includes a first edge aligner combining results 130 from the first plurality of representative logic circuits 110. In embodiments, the edge alignment is performed with a multiple input AND gate. For example, the first edge aligner can include an AND gate to which input signals are fed. Thus, only after all representative circuits assert a completion signal does the edge aligner assert a synchronization signal for the plurality of representative circuits. The flow 100 includes generating a first synchronization signal 150 derived from the results from the first plurality of representative logic circuits 110. The aforementioned first plurality of representative logic circuits can be from a first cluster. Similarly, a second cluster can operate with a second plurality of representative circuits. The first plurality of representative logic circuits can differ from the second plurality of representative logic circuits. Alternatively, the first plurality of representative logic circuits can be substantially similar to the second plurality of representative logic circuits.

The flow 100 includes a second enablement circuit that enables the second plurality of representative logic circuits 120. The flow 100 includes a second edge aligner combining results from the second plurality of representative logic circuits. The output of the second plurality of representative circuits is fed to an edge aligner. The flow 100 includes a second edge aligner combining results 140 from the second plurality of representative logic circuits. The flow 100 includes generating a second synchronization signal 160 derived from the results from the second plurality of representative logic circuits. The flow 100 includes a combined synchronization signal derived from the first synchronization signal and the second synchronization signal. The first synchronization signal and second synchronization signal are combined to generate a combined synchronization signal 170. The multiple synchronization signals can maintain the functional logic circuits within one tic cycle of one another. The tic cycle can be a single cycle of the hum generated self-clocking signal. Various steps in the flow 100 may be changed in order, repeated, omitted, or the like without departing from the disclosed concepts. Various embodiments of the flow 100 can be included in a computer program product embodied in a non-transitory computer readable medium that includes code executable by one or more processors.

Figure 2:
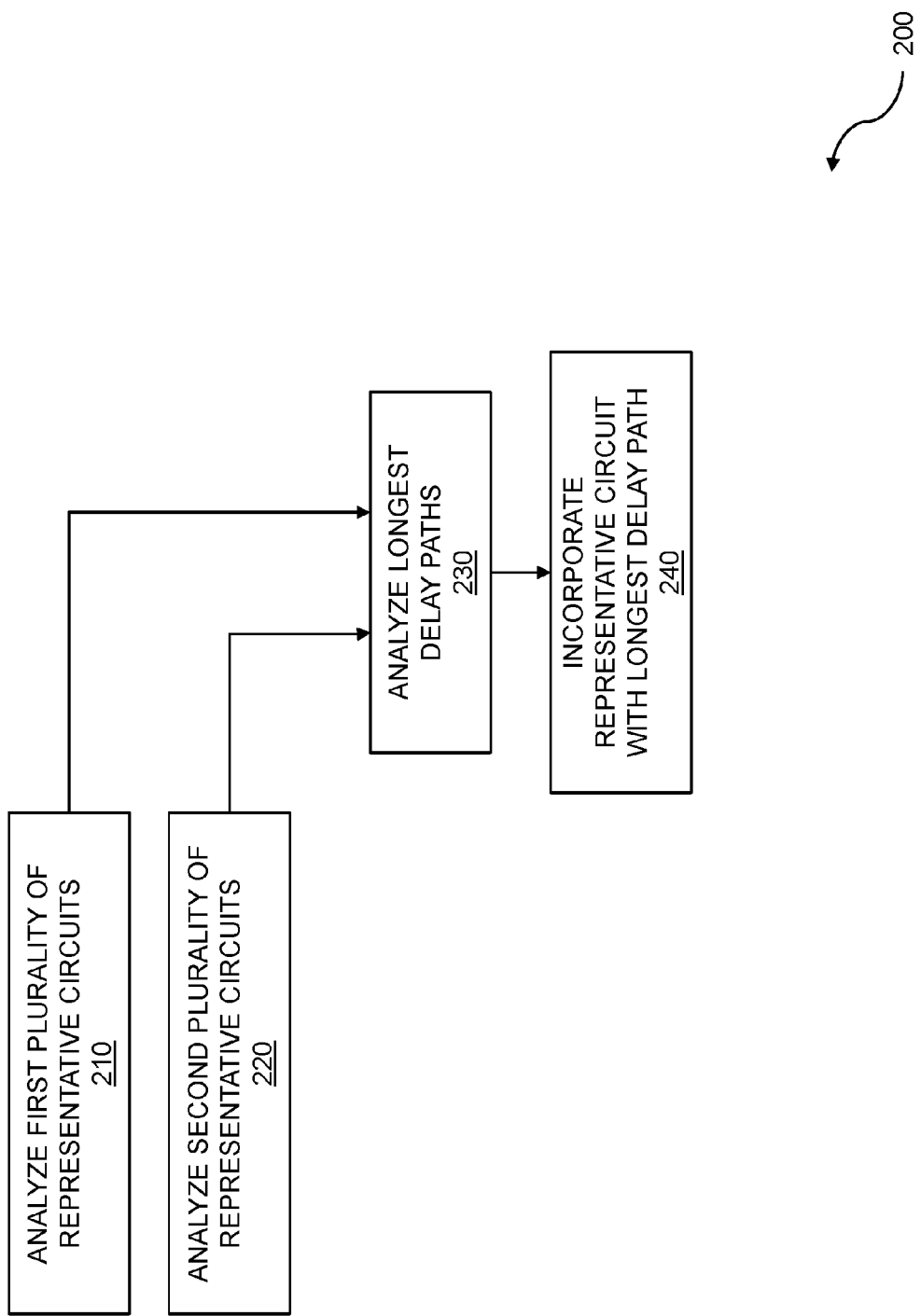
FIG. 2 is a flow diagram for path delay analysis.

FIG. 2 is a flow diagram for path delay analysis. The flow 200 includes analyzing a first plurality of representative circuits 210. The analyzing can include determining a delay path or completion time. In embodiments, the delay path is measured in a number of gates. The analysis can be performed using a software package such as Spice™ that can compute delay paths based on input conditions. The flow 200 includes analyzing a second plurality of representative circuits 220. The flow 200 continues with analyzing the longest delay paths 230 from the first plurality of representative circuits and the second plurality of representative circuits. The flow 200 continues with incorporating the representative circuit with the longest delay path 240. A representative circuit from both the first and the second plurality can be incorporated. The circuit with the longest delay path is included in the timing circuit of the cluster. The functional circuits within a cluster can be configured to start at the same time by a common enable signal. Thus, by basing the timing off the circuit with the longest delay path, the clock speed is guaranteed to be slow enough such that all functional circuits can complete within one tic cycle. Various steps in the flow 200 may be changed in order, repeated, omitted, or the like without departing from the disclosed concepts. Various embodiments of the flow 200 can be included in a computer program product embodied in a non-transitory computer readable medium that includes code executable by one or more processors.

Figure 3:
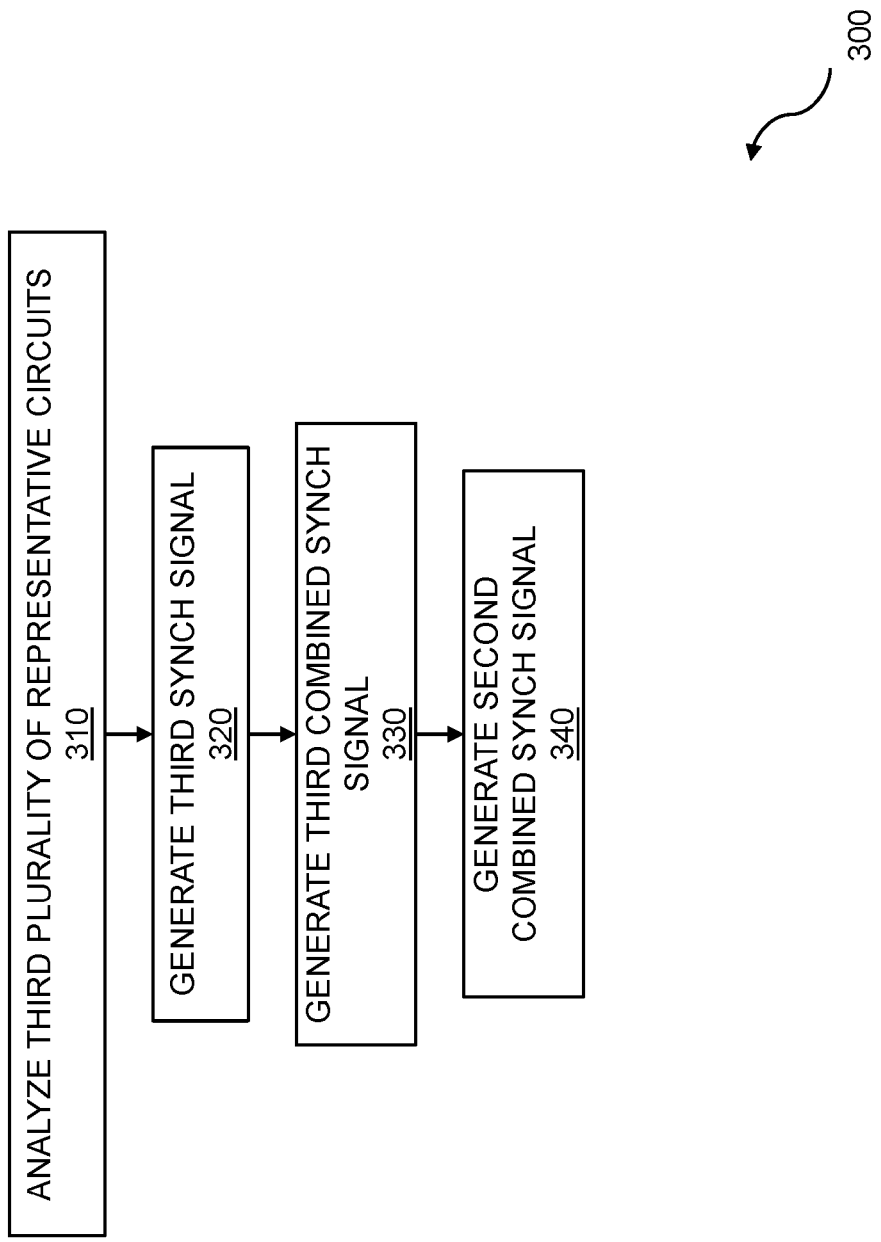
FIG. 3 is a flow diagram for further synchronization signal generation.

FIG. 3 is a flow diagram for further synchronization signal generation. The flow 300 comprises a third plurality of representative logic circuits, where the combined synchronization signal is further derived from a third synchronization signal derived from results from the third plurality of representative logic circuits. The third plurality of representative logic circuits can be included in a third cluster. While signals from three clusters are discussed in this disclosure, in practice, first level timing signals from four or more clusters can be combined to generate a combined synchronization signal. The flow 300 includes analyzing a third plurality of representative circuits 310. The flow 300 includes generating a third synchronization signal 320 based on the third plurality of representative circuits. The flow 300 continues with generating a third combined synchronization signal 330. The flow 300 continues with generating a second combined synchronization signal 340. The second combined synchronization signal can be based on the third combined synchronization signal 330, as well as the first synchronization signal and the second synchronization signal. Various steps in the flow 300 may be changed in order, repeated, omitted, or the like without departing from the disclosed concepts. Various embodiments of the flow 300 can be included in a computer program product embodied in a non-transitory computer readable medium that includes code executable by one or more processors.

Figure 4:
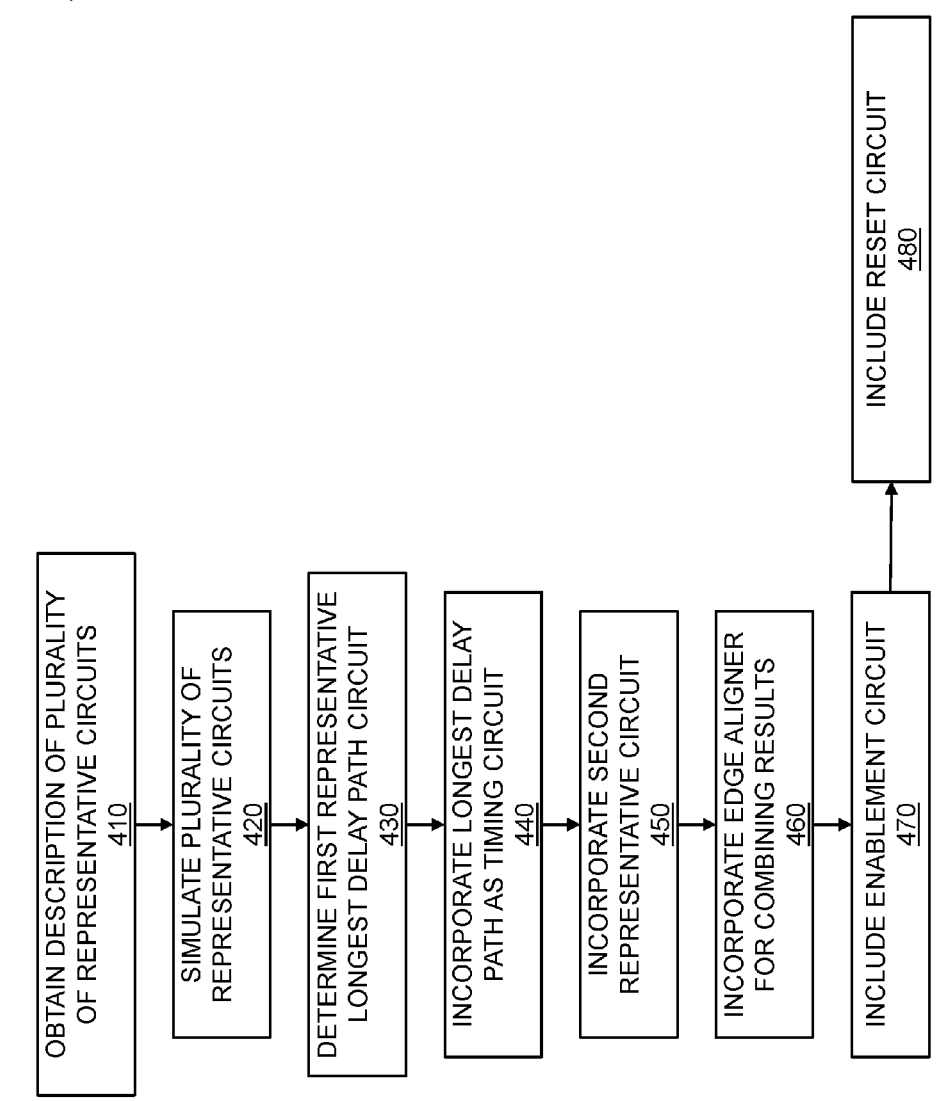
FIG. 4 is a flow diagram for incorporating representative circuits.

FIG. 4 is a flow diagram for incorporating representative circuits. The flow 400 includes obtaining a description of a plurality of representative logic circuits 410. The description can be in the form of a hardware description language such as Verilog™, VHDL, and/or a layout language such as OASIS™ or GDSII™. The flow 400 includes simulating the plurality of representative logic circuits 420. The simulation can be performed using circuit simulation software such as Spice™ or other suitable software. The aspects of the simulation can include completion time and/or delay paths. In embodiments, a static timing analysis is performed. The flow 400 includes determining a first representative circuit that is a longest delay path from the plurality of representative logic circuits 430. The representative circuit with the longest delay path is incorporated into a first level timing circuit within the cluster. The flow 400 includes incorporating the longest delay path from the plurality of representative logic circuits as a timing circuit 440 to generate a synchronization signal used in a hum fabric. In some cases, one representative circuit of the plurality of representative circuits can have a significantly longer delay path than other circuits of the plurality of representative circuits. In such a scenario, only one representative circuit need be included in the first level timing circuit, so as to simplify the design. However, in other cases, multiple representative circuits can have a similar delay path, or can indicate similar completion times during simulation. In those instances, multiple representative circuits can be included in the first level timing circuit. The multiple representative circuits can be configured in such a way that the circuit that completes last is the circuit that governs the timing signals output from the respective cluster.

The flow 400 further comprises incorporating a second representative circuit from the plurality of representative logic circuits 450. The flow 400 further comprises incorporating an edge aligner circuit for combining results 460 from the first representative circuit and the second representative circuit from the first plurality of representative logic circuits. When more than one representative circuit is included in a first level timing circuit, an edge aligner circuit is included to trigger when the slowest representative circuit completes.

The flow 400 comprises including an enablement circuit 470 that enables the first representative circuit and the second representative circuit from the first plurality of representative logic circuits. The enablement circuit 470 asserts to allow the representative circuits to start their next cycle. The flow 400 comprises including a reset circuit 480 that generates a reset pulse that resets the first representative circuit and the second representative circuit from the first plurality of representative logic circuits. The resetting and enabling can occur simultaneously or nearly simultaneously. Various steps in the flow 400 may be changed in order, repeated, omitted, or the like without departing from the disclosed concepts. Various embodiments of the flow 400 can be included in a computer program product embodied in a non-transitory computer readable medium that includes code executable by one or more processors.

Figure 5:
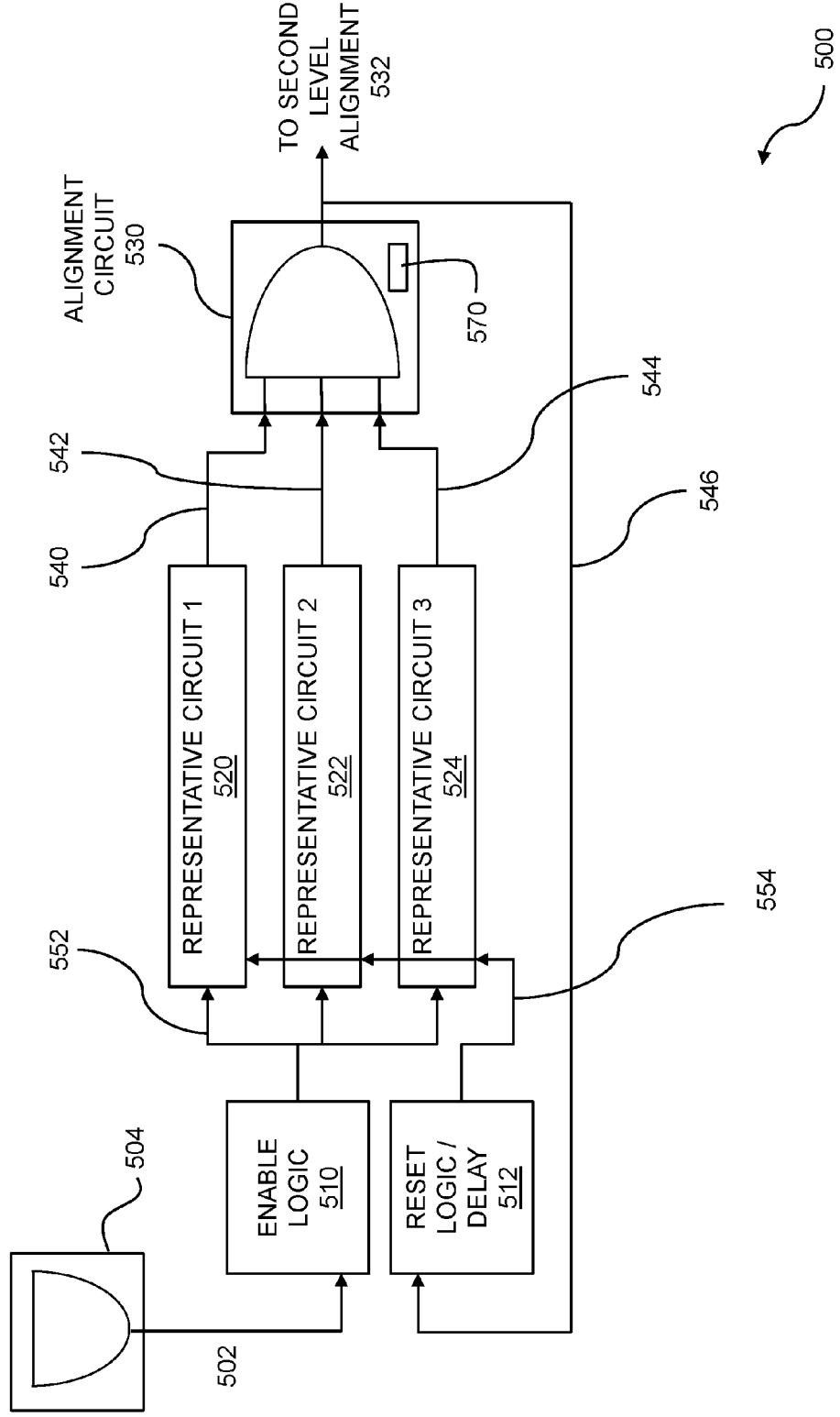
FIG. 5 shows an example block diagram of representative circuits.

FIG. 5 shows an example block diagram of representative circuits. The diagram 500 shows a first plurality of representative logic circuits, which includes a representative circuit 1 520, a representative circuit 2 522, and a representative circuit 3 524. The representative circuits are copies of functional circuits within a cluster. The plurality of representative logic circuits can comprise ring oscillators. The output 540 of the representative circuit 1 520 feeds into an alignment circuit 530. In embodiments, the alignment circuit 530 includes an AND gate.

The output 542 of the representative circuit 2 522 also feeds into the alignment circuit 530, and the output 544 of the representative circuit 3 524 also feeds into the alignment circuit 530. Note that while three representative circuits are shown in the diagram 500, in practice, more or fewer than three representative circuits can be used. The alignment circuit 530 serves as a first level alignment circuit (first edge aligner). The diagram 500 includes a first edge aligner combining results from the first plurality of representative logic circuits. As each representative circuit (520, 522, and 524) completes, its corresponding output (540, 542, and 544) is asserted. The diagram 500 includes an output from the first edge aligner that becomes active based on a longest delay path from the first plurality of representative logic circuits. Thus, when all outputs are asserted, the output of the alignment circuit 530 is asserted, serving as a first synchronization signal which is provided to the reset logic 512 as a derived signal 546, and is also sent to a second level alignment circuit as an alignment signal 532. In some cases, the derived signal 546 and the alignment signal 532 are the same signal. In other cases, the derived signal 546 can be a delayed version of the alignment signal 532. The alignment signal 532 can be used as a clock type signal for certain types of logic. In some embodiments, the first plurality of representative logic circuits is comprised of self-resetting logic circuitry and there is no specific reset logic 512 external to the representative circuits themselves.

The reset logic 512 can include some delay so that the representative circuits are reset at some period of time after the signal 546 becomes active. In some embodiments, the delay is a separate circuit from the reset logic 512 itself. The diagram 500 includes a first synchronization signal derived from the results from the first plurality of representative logic circuits. The output 532 of the alignment circuit 530 feeds into the reset logic 512 and also feeds to a second level alignment that is interconnected to multiple clusters, which will be shown further in FIG. 6. The reset logic 512 resets each representative circuit to an initial state via a reset signal 554. The diagram 500 includes a first enablement circuit that enables the first plurality of representative logic circuits (520, 522, and 524). The enable logic 510 receives a signal 502 from the second level alignment circuit to allow the representative circuits to start. The enable logic 510 provides an enable signal 552 to the representative circuit 1 520, the representative circuit 2 522, and the representative circuit 3 524. The signal 502 is asserted when all the interconnected second level alignment circuits indicate completion of respective representative circuits in their respective clusters. In this way, an entire mesh or fabric of clusters can operate synchronously with each other. In embodiments, the signal 502 comes from a combining circuit 504. Since clusters can receive input from multiple second level alignment circuits, the combining circuit 504 can be used to combine inputs from a first second level alignment circuit with inputs from a second level alignment circuit. When both second level alignment signals are asserted, the combining circuit 504 asserts the signal 502 to start the next tic and begin operation of the representative circuits (520, 522, and 524). In some embodiments, the alignment circuit 530 further includes a timing statistics register 570. The timing statistics register 570 can include fields to indicate the number of times each representative circuit was the "critical circuit" for timing, meaning that it was the last representative circuit to complete. The information in the statistics register can be used by chip designers to optimize designs. The timing statistics register 570 can be read and reset by a processor or other test equipment so its results can be accessed and cleared when appropriate.

Figure 6:
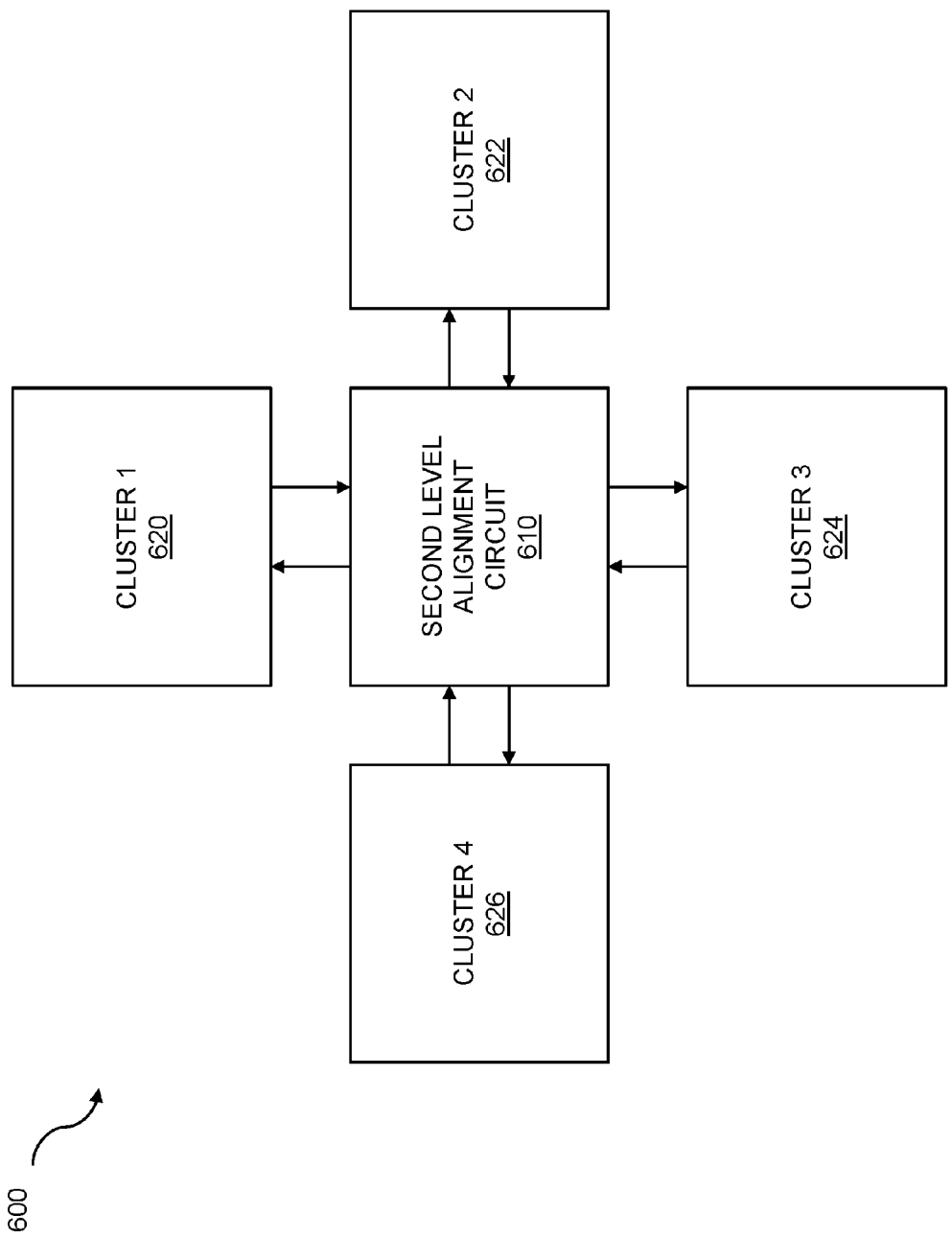
FIG. 6 shows an example second level alignment circuit.

FIG. 6 shows an example second level alignment circuit configuration. The example circuit 600 includes multiple clusters, a cluster 1 620, a cluster 2 622, a cluster 3 624, and a cluster 4 626, coupled to a second level alignment circuit 610. Each cluster can include an internal edge aligner, such as the one shown in FIG. 5. Thus, the circuit 600 includes a second edge aligner combining results from the second plurality of representative logic circuits. Each cluster can include an enablement circuit such as 510 of FIG. 5. Thus, the circuit 600 includes a second enablement circuit that enables the second plurality of representative logic circuits. The first plurality of representative logic circuits and the second plurality of representative logic circuits can comprise ring oscillators. The second level alignment circuit receives the output of the first level alignment circuit from each cluster. The clusters 620, 622, 624, and 626 each include a first level alignment circuit. Each cluster can include an edge aligner, and each cluster can produce a synchronization signal from the edge aligner. Thus, the circuit 600 includes a second synchronization signal derived from the results from the second plurality of representative logic circuits. The example circuit 600 can include a second edge aligner combining results from the second plurality of representative logic circuits. The representative circuits within each cluster can be different, or they can be similar. Some clusters can have more representative circuits than others. For example, the cluster 1 620 can have one representative circuit, the cluster 2 622 and the cluster 3 624 can each have three representative circuits, and the cluster 4 626 can have seven representative circuits. In such an example, the cluster 1 620 is a special case where only one representative circuit is used in the first level timing circuit. This simplifies the design in terms of edge alignment. However, when multiple functional circuits have similar delay paths or completion times, it is then preferable to utilize multiple representative circuits, such as previously depicted in FIG. 5. In the case where multiple representative circuits are used within a cluster, the edge aligner within the cluster produces an output of a synchronization signal when the slowest representative circuit completes.

Upon receiving a synchronization signal from each cluster (clusters 620, 622, 624, and 626), the second level alignment circuit 610 provides a second level alignment signal back to each cluster. This action triggers the enable logic (see 510 of FIG. 5) within those clusters, thereby starting the next tic of the timing cycle. Thus, the circuit 600 includes a combined synchronization signal derived from the first synchronization signal and the second synchronization signal.

Figure 7:
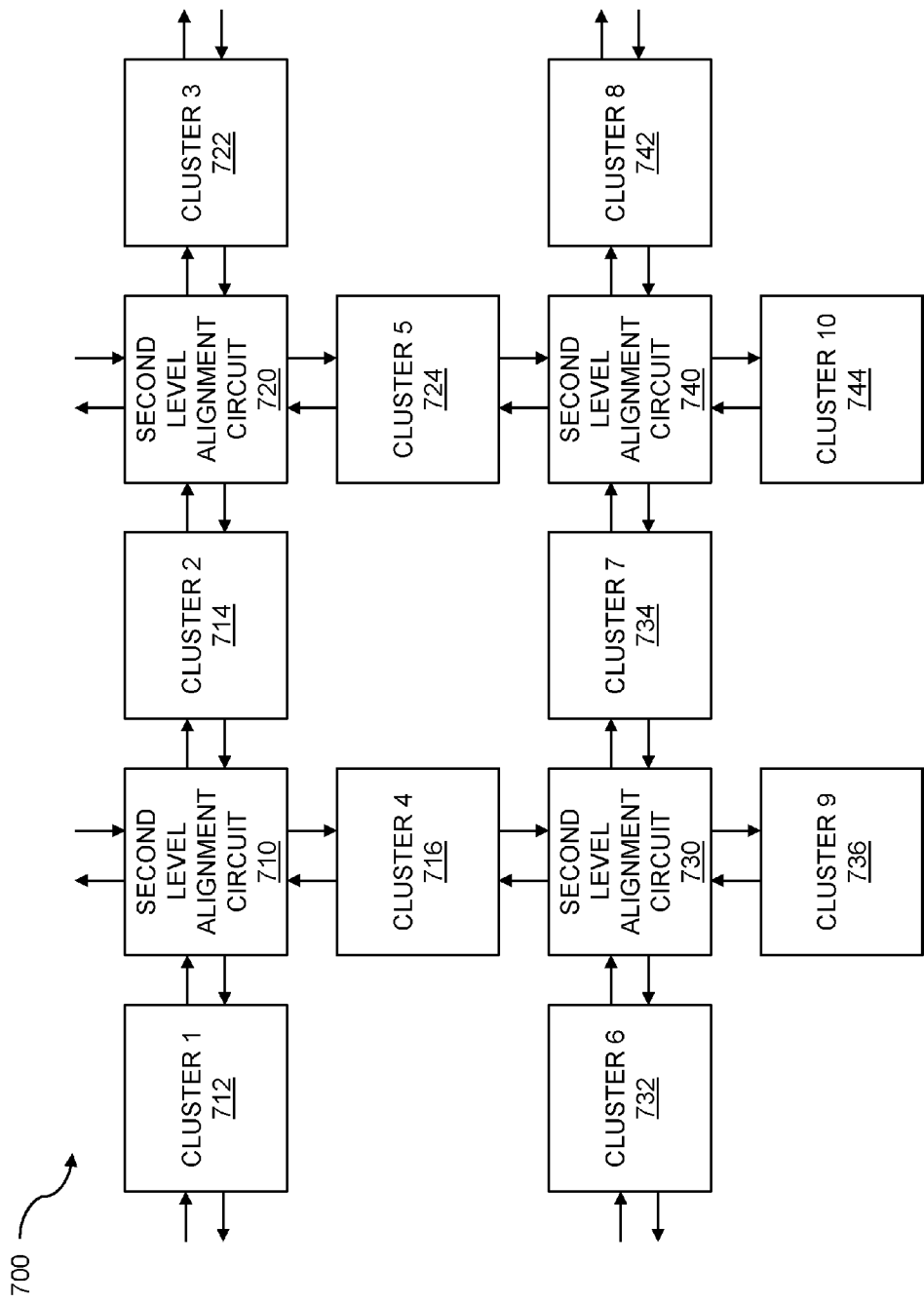
FIG. 7 shows example combined second level alignment circuits.

FIG. 7 shows example combined second level alignment circuits. The circuit 700 comprises a plurality of second level alignment circuits, circuits 710, 720, 730, and 740. Each second level alignment circuit can be coupled to multiple clusters. For example, the second level alignment circuit 730 is coupled to a cluster 4 716, a cluster 6 732, a cluster 7 734, and a cluster 9 736. Similarly, the second level alignment circuit 740 is coupled to the cluster 7 734, a cluster 5 724, a cluster 8 742, and a cluster 10 744. Furthermore, a cluster can be coupled to multiple second level alignment circuits. For example, the cluster 5 724 is coupled to the second level alignment circuit 720 and also is coupled to the second level alignment circuit 740. Similarly, the cluster 4 716 is coupled to the second level alignment circuit 710 as well as the second level alignment circuit 730. The second level alignment circuit 710 is coupled to a cluster 1 712, a cluster 2 714, and the cluster 4 716. The second level alignment circuit 720 is coupled to a cluster 3 722, the cluster 2 714, and the cluster 5 724.

In such an embodiment, the cluster 4 716 comprises a combining circuit to combine the second level alignment signals from the circuit 710 and the circuit 730. In this way, the representative circuits of the timing circuit within the cluster 4 716 are enabled upon receiving a synchronization signal from both second level alignment circuits (710 and 736). Thus, the first plurality of representative logic circuits and the second plurality of representative logic circuits can comprise a hum generation fabric. The hum generation fabric can provide multiple synchronization signals to functional logic circuits distributed across the hum generation fabric. The multiple synchronization signals can maintain the functional logic circuits within one tic cycle of one another.

Figure 8:
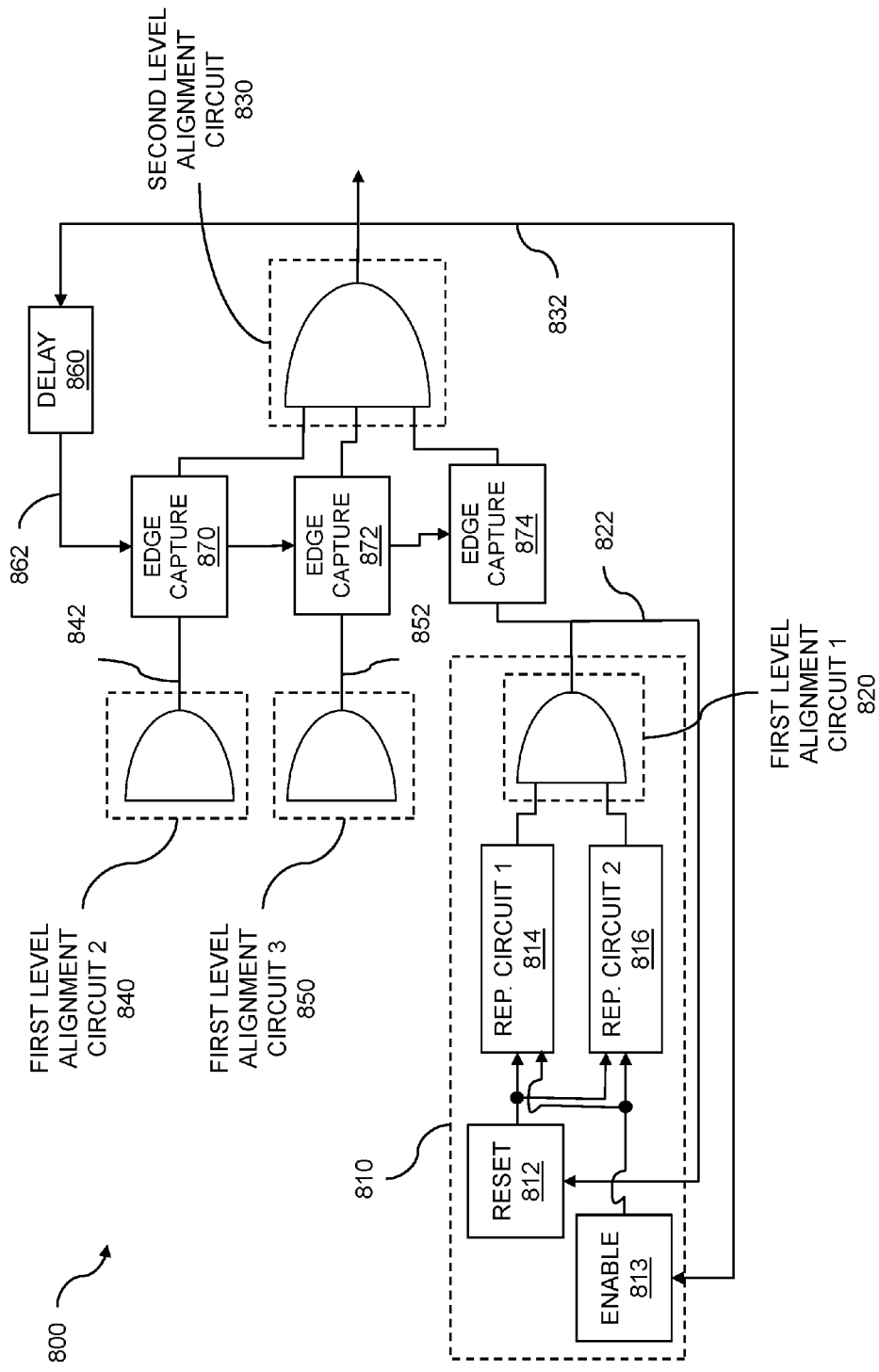
FIG. 8 shows an example schematic of a timing circuit.

FIG. 8 shows an example schematic of a timing circuit. The schematic 800 shows a first plurality of representative logic circuits which can be selected for their timing characteristics, as previously discussed. The representative logic circuits are indicated as representative circuit 1 814 and representative circuit 2 816. In embodiments, while two representative logic circuits are shown, one or more representative logic circuits are included in the timing circuit. The schematic 800 includes a first level alignment circuit 820 combining results from the first plurality of representative logic circuits. The schematic 800 includes a first enablement circuit 813 that enables the first plurality of representative logic circuits. The schematic 800 includes a first synchronization signal 822 that can be derived from the results from the first plurality of representative logic circuits.

The schematic 800 includes another first level alignment circuit 840 that combines results from a second plurality of representative logic circuits (not shown). The schematic 800 includes yet another first level alignment circuit 850 combining results from a third plurality of representative logic circuits (not shown). Each first level alignment circuit, or aligner, (820, 840, and 850) can be disposed within a different cluster. An output of each cluster can be captured by edge capture circuits. The schematic 800 includes an edge capture circuit 870 to capture an output signal 842 from the first level alignment circuit 840, an edge capture circuit 872 to capture an output signal 852 from the first level alignment circuit 850, and an edge capture circuit 874 to capture an output signal 822 from the first level alignment circuit 820. The edge capture circuits capture an edge from their respective incoming signals and retain a consistent output until the edge capture circuit is reset. In this manner, the first level alignment signal can be reset but the edge capture circuit output is held active until its value is used by a second level alignment circuit. The edge capture circuit can include a latch, a flip-flop, a storage element, and so on. The edge capture circuit can capture a rising edge of a signal, a falling edge of a signal, a signal transition, etc. The capture circuit can be used to capture a first or other edge of a signal. In embodiments, the outputs from the first level alignment circuits are also used for reset purposes, self-timing purposes, and so on. In embodiments, the edge capture circuits capture results from the first level alignment circuits and hold the results until the second level alignment circuit can use the results from all of the first level alignment circuits. The output 822 of the first level aligner 820 can be configured to activate a reset circuit 812. The reset circuit 812 places each representative circuit (814 and 816) into an initial state. Similarly, the output 842 of the first level alignment circuit 840 can activate a reset circuit within its respective cluster, and the output 852 of the first level alignment circuit 850 can activate a reset circuit within its respective cluster.

Each edge capture circuit can be coupled to second a level alignment circuit 830. The output from the edge capture circuit 874 can be coupled to the second level alignment circuit 830. The output from the edge capture circuit 872 can be coupled to the second level alignment circuit 830. The output from the edge capture circuit 870 can be coupled to the second level alignment circuit 830. While the outputs from three edge capture circuits are shown, in practice one or more outputs from edge capture circuits can be coupled to a second level alignment circuit.

The output of the second level alignment circuit 830 can be a second level synchronization signal 832 that can trigger the enable circuit 813 of the timing circuit 810. The enable circuit 813 can assert a signal that can allow the representative circuit 814 and the representative circuit 816 to begin operation, starting from the initial state caused by the reset circuit 812. Similarly, the second level synchronization signal 832 can be connected to an enable circuit like the enable circuit 813 in the other clusters to which it is coupled. Each cluster can include a timing circuit similar to the timing circuit 810. In embodiments, the enable circuit 813 is configured to de-assert after a predetermined time interval, such that the enable signal may de-assert prior to the next tic. In some embodiments, the second level synchronization signal 832 can be used to generate a reset signal as well for the representative logic circuits. In this situation, the reset circuit 812 is coupled to the second level synchronization signal 832 rather than the output 822 of the first level aligner 820.

The output 832 of the second level alignment circuit 830 can be coupled to a delay 860. The delay can be a circuit that can be based on a specific time delay. The output 862 of the delay 860 can be configured to activate a reset of the one or more edge capture circuits. As seen in the schematic 800, the signal 862 can reset edge capture circuits 870, 872, and 874. The reset signal 862 can place each edge capture circuit 870, 872, and 874 into an initial state. In embodiments, the reset signal 862 is the same as the other reset signals 864 and 866 for the other edge capture latches. The initial states of the edge capture circuits can set up these circuits to capture edges (e.g. rising edges) of signals from the plurality of first level alignment circuits. The second level synchronization signal 832 can be used as a clock type signal for certain types of logic.

Figure 9:
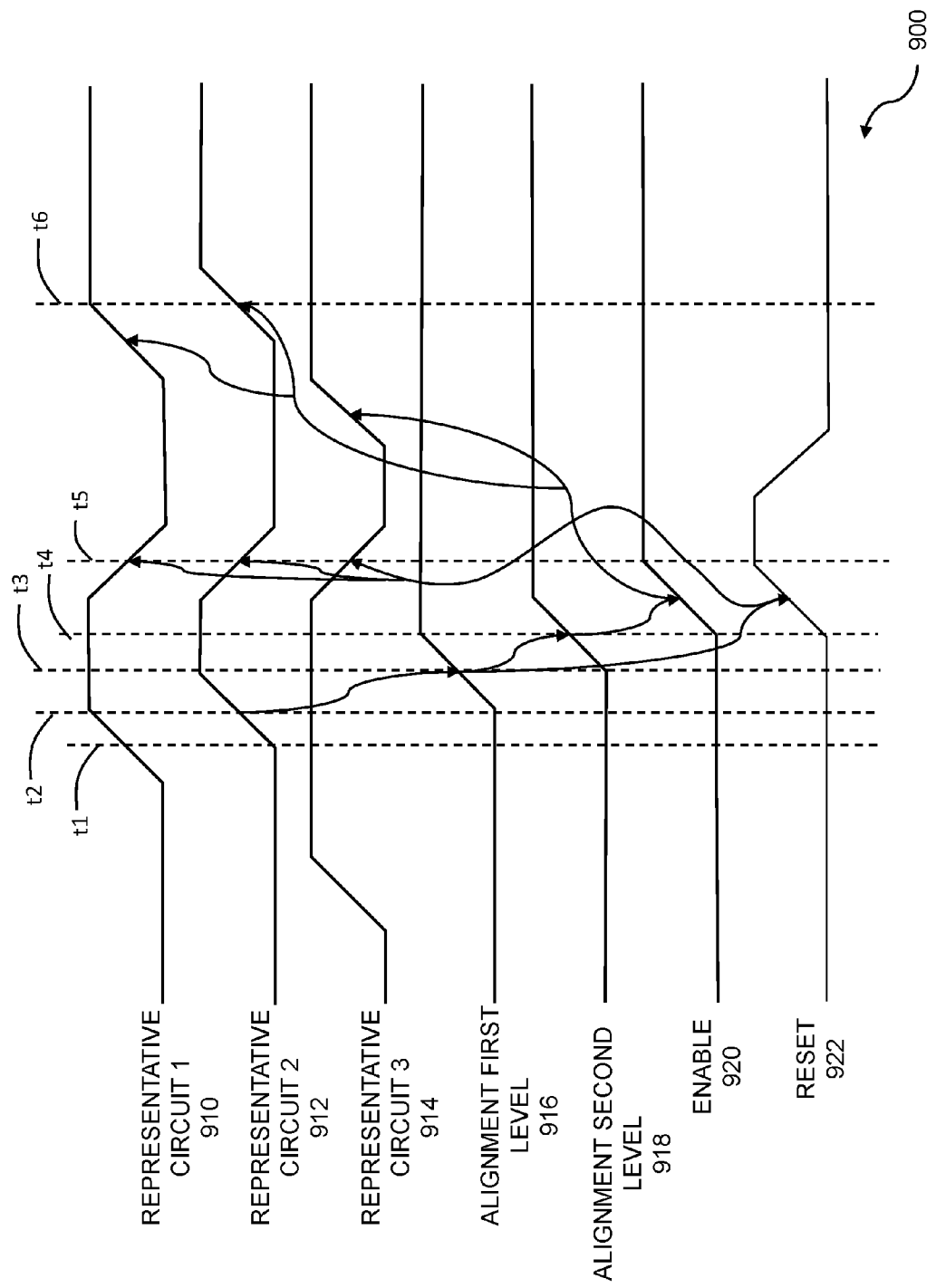
FIG. 9 shows logic waveforms for representative circuits and alignment.

FIG. 9 shows a waveform diagram of logic waveforms for representative circuits and alignment. The waveform diagram 900 shows an output from the first edge aligner that becomes active based on a longest delay path from the first plurality of representative logic circuits. A signal 910 is a completion signal from a first representative circuit. A signal 912 is a completion signal from a second representative circuit. A signal 914 is a completion signal from a third representative circuit. The completion signals are asserted (in this example, with a logical high) when the corresponding representative circuit completes. In practice, when a signal is asserted, it takes a finite amount of time for the signal to go from a de-asserted state to an asserted state. In this example, each representative circuit completes at a different time, and the signal 912 is the "critical signal" since it is the last signal to begin a transition to the asserted state at time $t_1$. Since the representative circuit completion signal 910 and the representative circuit completion signal 914 already transitioned to an asserted state prior to time $t_1$, the alignment is predicated on the signal 912, corresponding to the slowest representative circuit. At time $t_2$, the signal 912 rises and passes a certain threshold, causing the first level alignment signal 916 to begin to assert. At time $t_3$, the signal 916 passes a certain threshold, causing the second level alignment signal 918 to assert. This example assumes that any other coupled clusters have already asserted their respective first level synchronization signals, and hence, all conditions are now met for the second alignment signal to be asserted.

At time $t_4$, the signal 918 passes a certain threshold, causing the enable signal 920 to begin to assert. The reset signal 922 is derived from the first level alignment signal 916. The reset signal 922 can be in the form of a pulse. The reset signal 922 causes the representative circuits to be reset, shown here as being at time $t_5$. It will be understood that the representative circuits can require differing amounts of time to actually reset to an initial state. Thus, the downward transition on representative circuit completion signal 910, signal 912, and representative circuit completion signal 914 can occur at slightly different times as a function of delay to reset the various representative circuits. The enable signal 920 causes the representative circuits to become active for evaluating the next hum tic cycle, with the last representative circuit reaching its asserted state at time $t_6$. It will be understood that in certain embodiments, only one representative circuit is needed within a cluster. In these cases, various circuits can be simulated before fabrication and only the one, slowest, representative circuit is included in the cluster timing analysis logic to produce hum signal commensurate with the needed time delay to complete logical calculation within the cluster.

A hum circuit can be included in an instance of a coarse grain reconfigurable array, a field programmable array, an array of processing elements, or other configurable array circuit. An instance of the hum circuit can be included in one or more array clusters. Each array element can have a local oscillator and a synchronization (sync) circuit. The sync circuit can be used to synchronize the oscillator with neighboring oscillators in order to enable efficient nearest-neighbor transfers of data, control signals, instructions, etc. The oscillator can include a model of the critical path of a given cluster design. The oscillator model can be used to control the generation of a local clock for the given cluster. The rising edge transition of this local oscillator can be used to synchronize the oscillation period of the given cluster with the neighboring elements of neighboring clusters. Each oscillator can send out a rising edge transition to four adjacent neighbors. Each oscillator can receive the rising edge transition from its four neighbors. Each oscillator can self-reset, and can wait for a signal that indicates that synchronization is done. The synchronization done signal can be generated by detecting the rising edge of the local oscillator and the rising edges of the neighboring oscillators. The synchronization signal can be used to determine the subsequent rising edge, and hence the oscillation period, by performing a simple arithmetic operation such as determining the time difference between the two rising edges. The synchronization circuit can self-reset and can wait for the next transition of a synchronization done signal.

Figure 10:
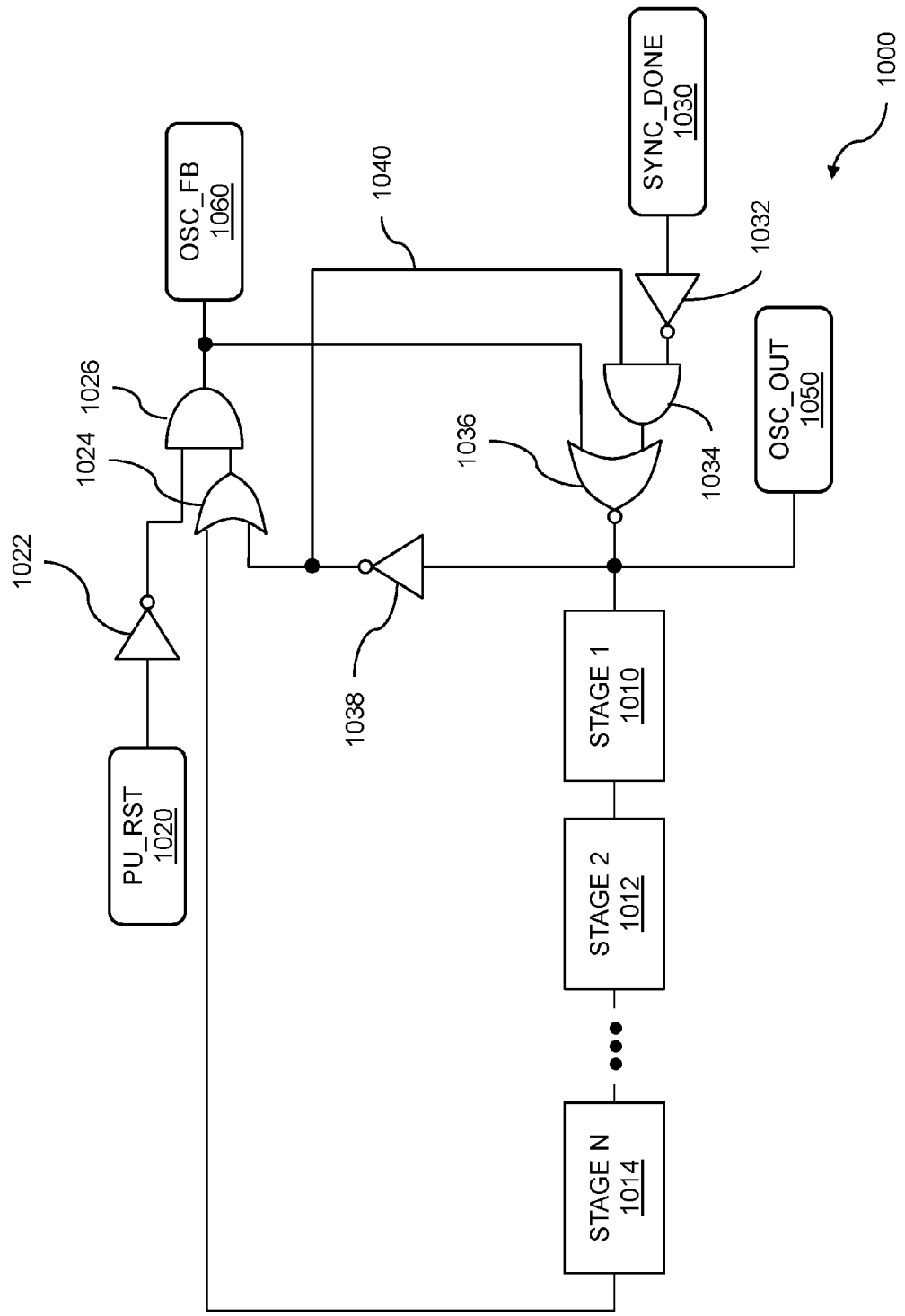
FIG. 10 illustrates an oscillator circuit with critical paths.

FIG. 10 illustrates an oscillator circuit with critical paths. The oscillator can be included among one or more pluralities of representative logic circuits in an apparatus for signal generation. Edge aligners combine results from each plurality of representative logic circuits. The representative logic circuits are enabled by one or more enablement circuits. A synchronization signal is derived from the results from the plurality of representative logic circuits. Synchronization signals derived from the one or more pluralities of representative logic circuits can be combined. The pluralities of representative circuits include a hum generation fabric. The oscillator circuit with critical paths 1000 includes stages of a processor, stage 1 1010, stage 2 1012, and stage n 1014, and a reset technique. While three stages of the processor, stages 1010, 1012, and 1014 are shown, other numbers of stages can be included. The oscillator circuit can be used to model a critical path of the processor. The critical path can be implemented with dynamic circuit families in the datapath, with static CMOS circuit families, with a combination of logic families, and so on. The critical path can be gate-dominated, wire-dominated, or both, where delays are introduced by logic gates and interconnecting wire. The model can be reset using a reset signal pu_rst 1020. The reset signal pu_rst 1020 when active is inverted by inverter 1022, causing AND gate 1026 to reset output signal oscillator feedback, osc_fb 1060, to logic zero. The output of AND 1026 also feeds NOR gate 1036. When the synchronization done signal, sync_done 1030 becomes active, signal 1030 is inverted by inverter 1032 that is coupled to AND gate 1034. The output of NOR gate 1036 transitions to logic one. Oscillator output, osc_out 1050, becomes a logic 1, and inverter 1038 causes signal 1040 to become logic 0. The signal osc_out 1050 propagates through stages 1010, 1012, and 1014, and arrives at an input to OR gate 1024. Signal pu_rst has returned to logic zero, and the output of AND gate 1026 becomes logic 1. The output of AND gate 1026 is the oscillator feedback signal, osc_fb 1060, a logic 1. The transition to a logic one of AND gate 1026 causes NOR gate 1036 to switch to logic zero, setting osc_out to zero, and causing signal 1040 to become logic one. The logic 1000 has been self-reset and is awaiting the next transition to logic one of signal sync_done 1030.

Figure 11:
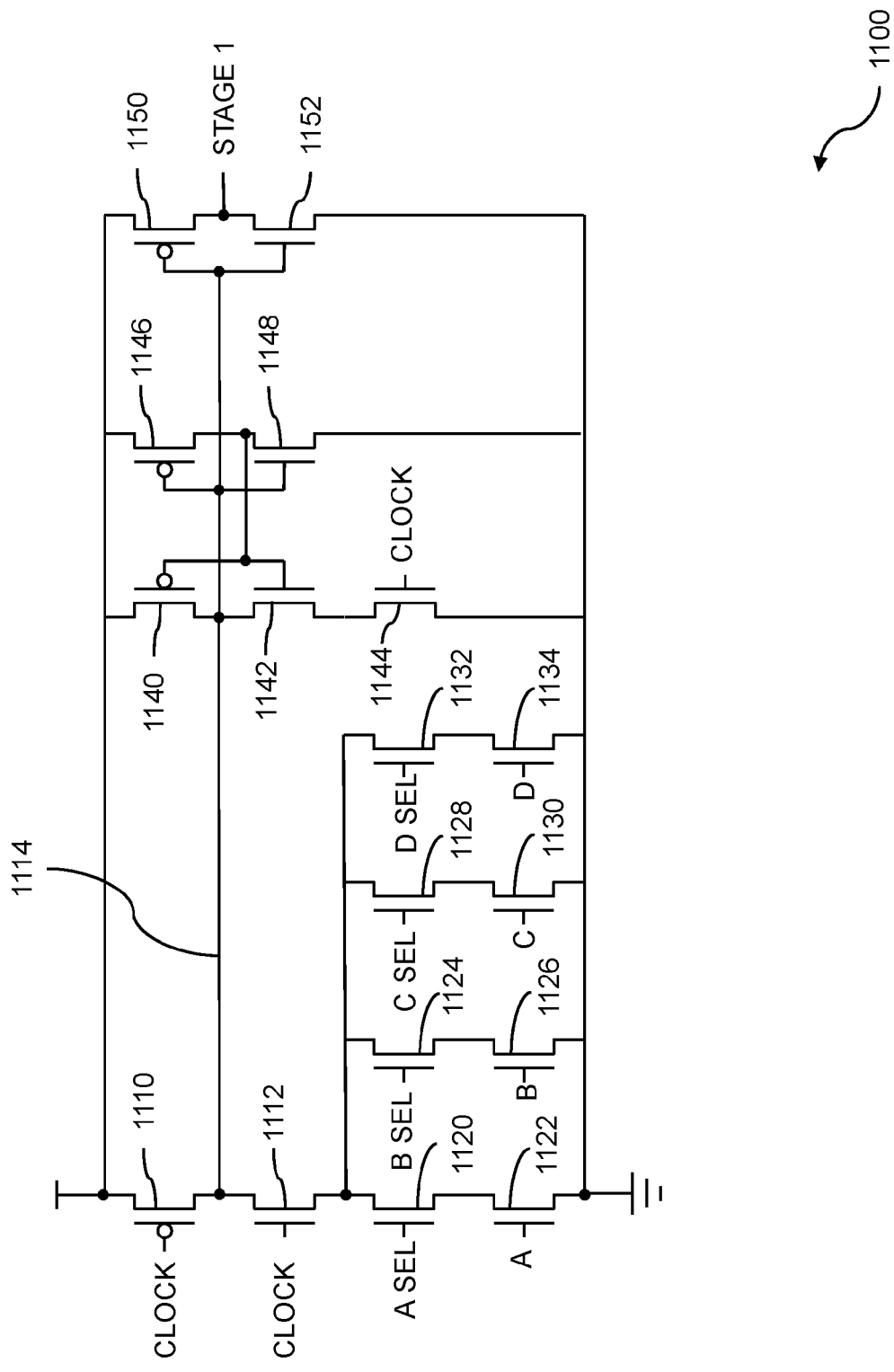
FIG. 11 shows a critical path delay cell model of a dynamic mux.

FIG. 11 shows a critical path delay cell model of a dynamic mux. An apparatus for signal generation includes representative logic circuits. An edge aligner combines results from the representative logic circuits, and an enablement circuit enables the representative logic circuits. A synchronization signal is derived from the results from the representative logic circuits. Multiple synchronization signals can be generated for multiple groups of representative logic circuits, and a combined synchronization signal can be derived from the multiple synchronization signals. In embodiments, the hum generation fabric can provide multiple synchronization signals to functional logic circuits distributed across the hum generation fabric. A critical path delay cell model 1100 can be generated for a dynamic multiplexer (mux).

The dynamic mux 1100 includes a clock signal that can serve to pre-charge node 1114 and to enable the mux circuit 1100 to break the feedback loop in a cross-coupled inverter latch, and so on. The mux includes a PFET device 1110 that when clock is low, pre-charges node 1114. NFET devices 1120, 1122, 1124, 1126, 1128, 1130, 1132, and 1134 form an AND-OR structure. When one or more of A, B, C, or D are logic high, and one or more of the corresponding select lines a sel, b sel, c sel, or d sel are active high, and clock transitions to logic high, NFET device 1112 turns on and node 1114 discharges. If no combination of a data signal (A, B, C, or D) and the corresponding selection signal (a sel, b sel, c sel, or d sel) for the data signal is active, then node 1114 remains at logic high. PFET transistors 1140 and 1146, in combination with NFET transistors 1142 and 1148 form a latch circuit from cross-coupled inverters. When the clock signal goes to logic high, then NFET device 1144 is enabled, and the value of node 1114 is latched into the cross-coupled inverters that form the latch. Transistors PFET 1150 and NFET 152 form an output inverter. Here, the output inverter buffers the signal from the cross-coupled inverters to form output signal stage 1.

Figure 12A:
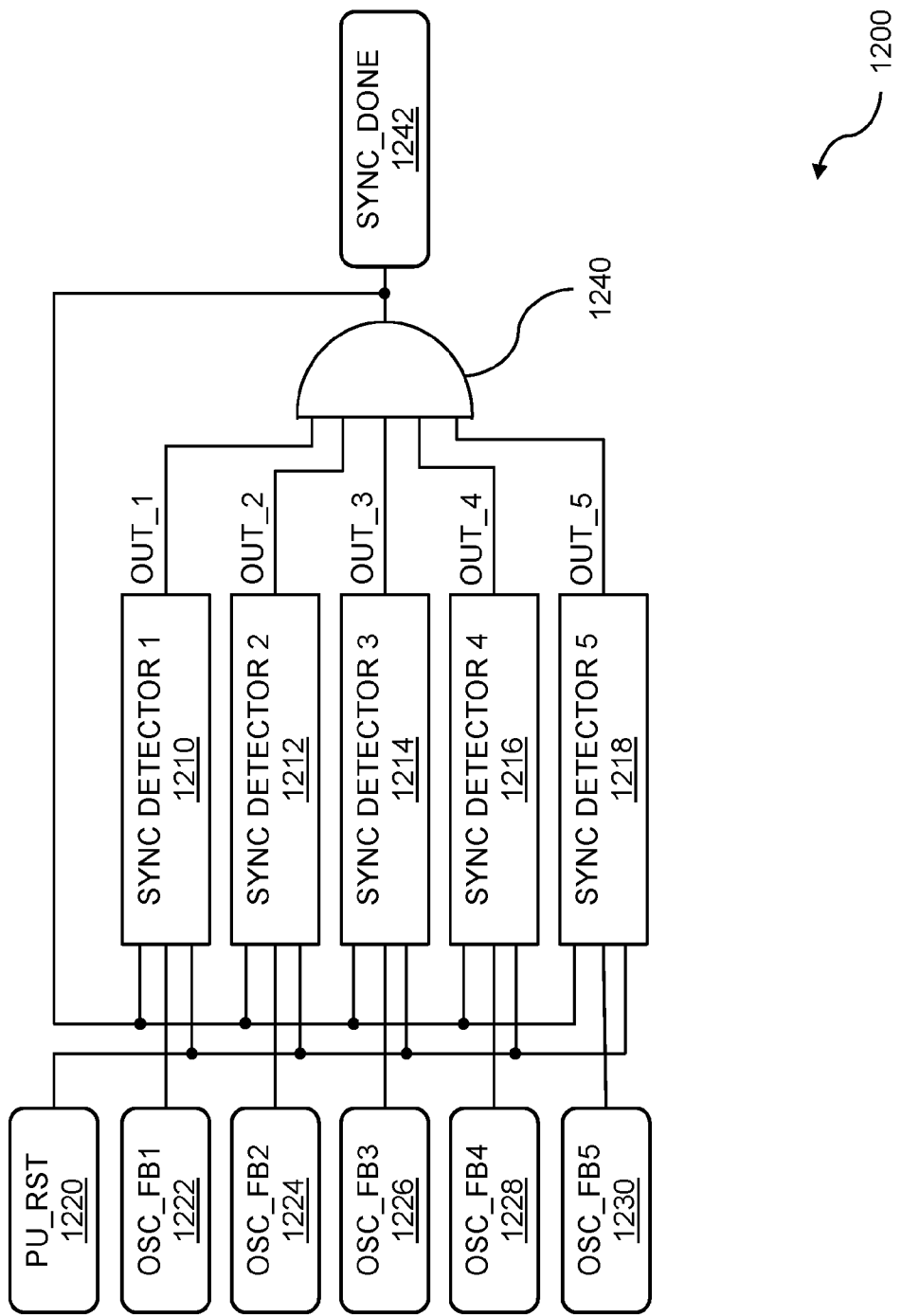
FIG. 12A illustrates sync done signal generation.

FIG. 12A illustrates sync done signal generation. A synchronization signal is derived by a signal generation apparatus. The signal generation apparatus includes a plurality of representative logic circuits. An edge aligner combines results from the plurality of representative logic circuits, and an enablement circuit enables the plurality of representative logic circuits. A synchronization signal is derived from the results from the plurality of representative logic circuits. Synchronization signals from multiple pluralities of representative logic circuits are combined into a combined synchronization signal. Synchronization done (sync done) signal generation is shown 1200. The sync done signal is generated from a local oscillator and from neighbor oscillators. The oscillator feedback signals include osc_fb1 1222, osc_fb2 1224, osc_fb3 1226, osc_fb4 1228, and osc_fb5 1230. While five oscillator feedback signals are shown, one for the local oscillator and four for the neighbor oscillators, other numbers of oscillator feedback signals can be used to generate a synchronization done signal. The synchronization done signal sync_done 1242, is generated by using AND gate 1240 to AND the output signals out_1, out_2, out_3, out_4, and out_5 from synchronization detectors sync detector 1 1210, sync detector 2 1212, synch detector 3 1214, sync detector 4 1216, and sync detector 5 1218, respectively. The synchronization done signal, sync_done 1242, can be used to self-reset synchronization detectors sync detector 1 1210, sync detector 2 1212, sync detector 3 1214, sync detector 4 1216, and sync detector 5 1218. A reset signal, pu_rst 1220 can be used to reset the one or more sync detectors such as sync detector 1 1210, sync detector 2 1212, sync detector 3 1214, sync detector 4 1216, and sync detector 5 1218.

The high transition of each of the oscillator feedback signals, osc_fb1 1222, osc_fb2 1224, osc_fb3 1226, osc_fb4 1228, and osc_fb5 1230, can be latched at an output node such as out_1, out_2, out_3, out_4, and out_5. As mentioned elsewhere, the output signals, out_1, out_2, out_3, out_4, and out_5, are ANDed to generate the synchronization done signal, sync_done 1242. The sync_done signal 1242 is fed to the local oscillator as well as fed back as a self-resetting technique for subsequent transitions.

The first plurality of representative logic circuits and the second plurality of representative logic circuits, both mentioned elsewhere, can include a hum generation fabric. In embodiments, the hum generation fabric can provide multiple synchronization signals to functional logic circuits distributed across the hum generation fabric. The functional logic circuits can include dynamic circuits, static CMOS circuits, and so on. The hum generation fabric can form a clock generation structure. A period of oscillation can be determined. The period of oscillation Tosc is calculated as follows using the following equation:

$$Tosc = \text{Max}\{Tcrit\_self, Tcrit\_neigh\} + Tdet$$

where:
Tcrit_self=critical path delay of the self-oscillator,
Tcrit_neigh=critical path delay of the neighboring oscillators, and
Tdet=delay of the synchronization circuit.

It is noted that the critical path delay can be circuit dominated, interconnection delay dominated, or a combination of both delay factors, for a given oscillator and for the neighboring oscillators.

Figure 12B:
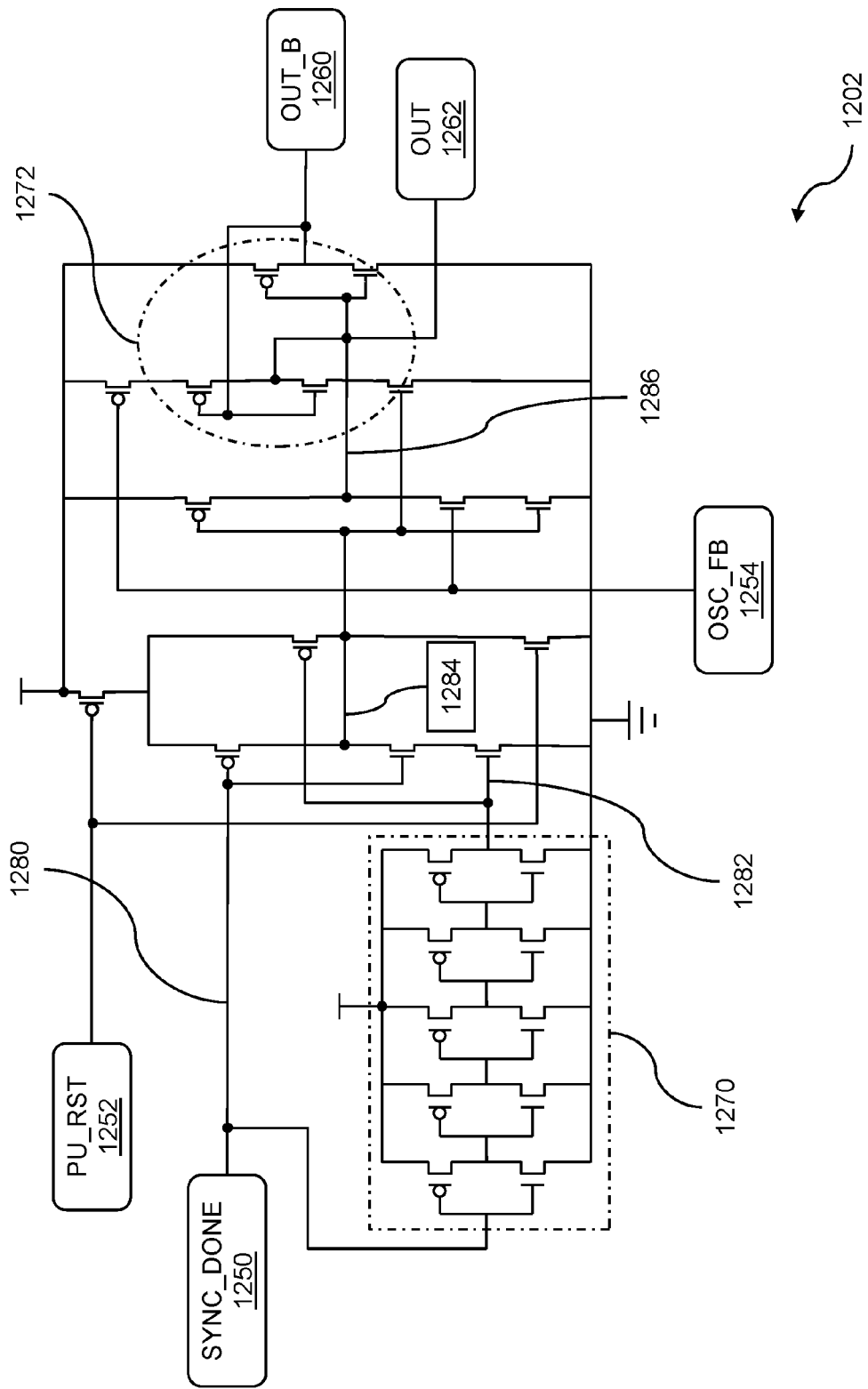
FIG. 12B illustrates a sync detector circuit.

FIG. 12B illustrates a sync detector circuit. An apparatus generates a signal, where the signal can be used for synchronization. The results from a plurality of representative logic circuits are combined by an edge aligner. An enablement circuit enables the plurality of representative logic circuits. A synchronization signal is derived from results from the plurality of representative logic circuits. Multiple synchronization signals from multiple pluralities of representative logic circuits can be combined. An example synchronization detector circuit 1202 includes signal inputs synchronization done sync_done 1250, reset pu_rst 1252, and oscillator feedback osc_fb 1254. The synchronization detector circuit 1202 includes signal outputs oscillator out, out 1262, and buffered oscillator out, out_b 1260. Inverter chain 1270 can act as a delay chain, and can represent a series of elements in a processor, a plurality of representative logic circuits, and so on. Initially, with pu_rst 1252 high and sync_done 1250 low, node 1280 is low, node 1282 is high, and node 1284 is low. While 1284 is low, node 1286 is pulled high, so that output out 1262 is high, and output out_b 2160 is low. Pu_rst goes low and sync_done goes high. Node 1280 goes high and node 1284 continues to be pulled low until node 1282 transitions to zero. Osc_fb going high, causes out 1262 to go low. Osc_fb going high returns out 1282 to low. Section 1272 of the circuit 1202 includes two cross-couple inverters which act as a latch.

Figure 13:
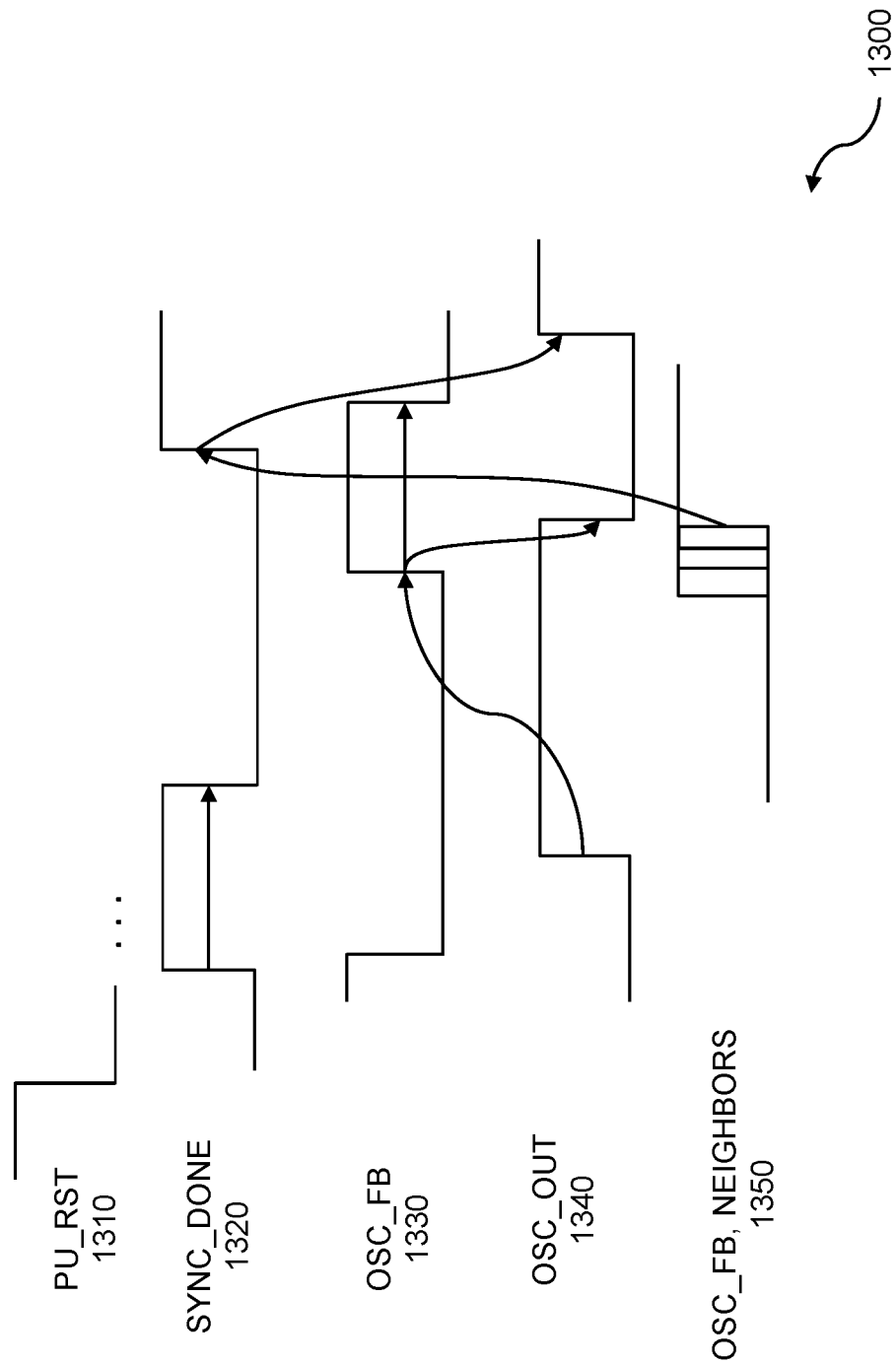
FIG. 13 shows timing waveforms.

FIG. 13 shows timing waveforms 1300. An apparatus for signal generation generates a synchronization signal. The synchronization signal can be provided to functional logic circuits that can be distributed across a hum generation fabric. The results from a plurality of representative logic circuits are combined by an edge aligner. An enablement circuit enables the plurality of representative circuits. A synchronization signal is derived from the results from the plurality of representative logic circuits. Synchronization signals from multiple pluralities of representative logic circuits can be combined. Timing can begin with the reset signal pu_rst 1310 going low. The synchronization signal sync_done 1320 goes high, and the oscillator feedback signal osc_fb 1330 transitions from logic high to logic low. The transition of the oscillator output signal osc_out 1340 causes the oscillator feedback signal osc_fb 1330 to transition high, and the oscillator output signal osc_out transitions back low. The oscillator feedback signals 1350 of neighboring clusters of circuits, processors, etc., can be included in the synchronization of a given plurality of representative logic circuits. The transition of all the neighboring oscillator feedback signals to logic high causes the synchronization done signal sync_done 1320 to transition high. The various transitions can repeat. The pluralities of representative logic circuits, such as the first plurality of representative logic circuits and the second plurality of representative logic circuits, can include a hum generation fabric.

Figure 14:
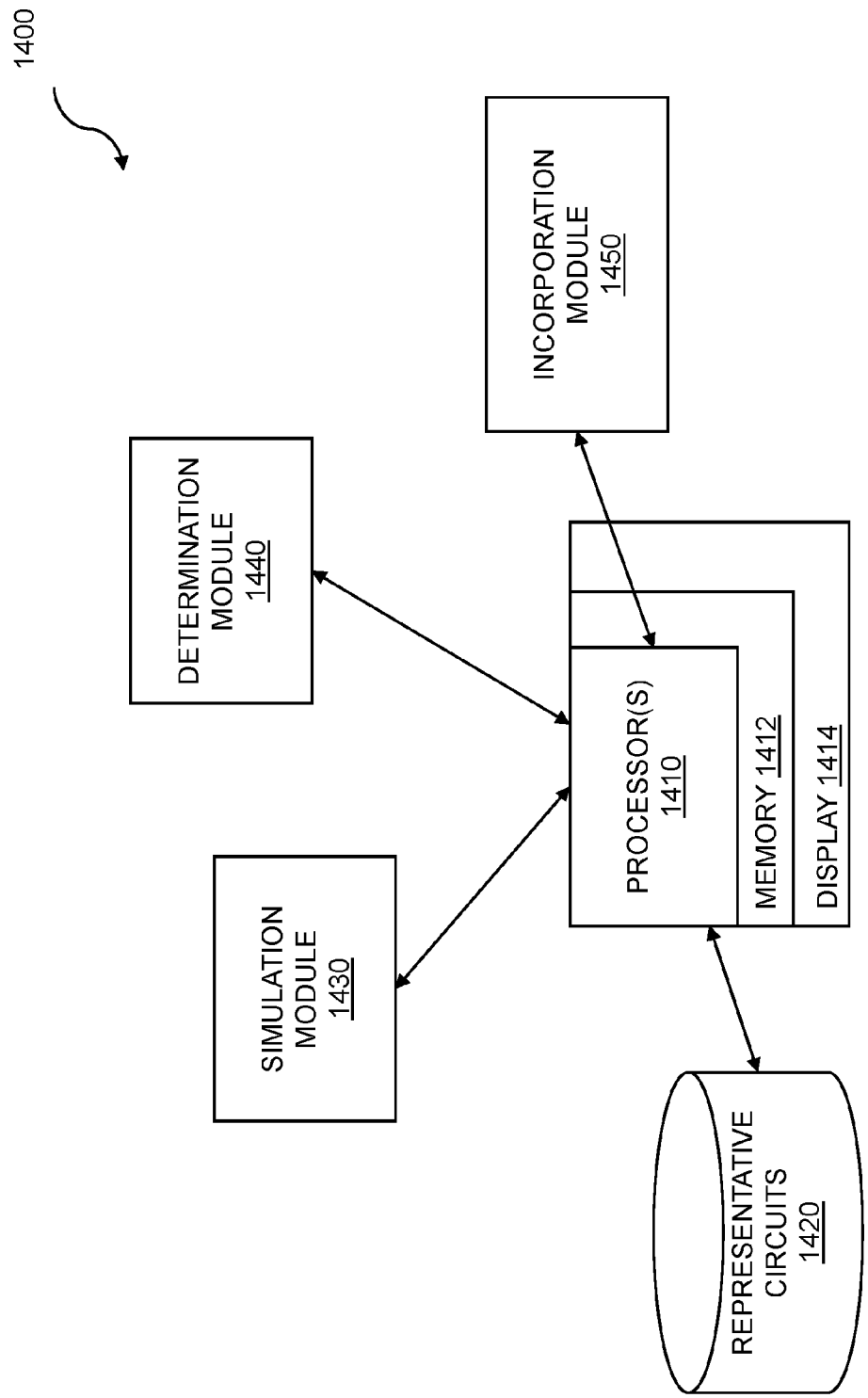
FIG. 14 is a system diagram for hum generation using representative circuits.

FIG. 14 is a system diagram for hum generation using representative circuits. The system 1400 can include one or more processors 1410 and a memory 1412 which stores instructions. The memory 1412 is coupled to the one or more processors 1410, where the one or more processors 1410 can execute instructions stored in the memory 1412. The memory 1412 can be used for storing instructions, for storing circuit designs, for storing logic designs, for system support, and the like. The one or more processors 1410 coupled to the memory 1412 can be configured to include a plurality of representative circuits 1420, such as from a library or database. The representative circuits 1420 can represent a variety of functional circuits, including, but not limited to, adders, shifters, comparators, sequential circuits, programmable circuits, and logic circuits. The one or more processors 1410 can interact with a simulation module 1430 for analyzing timing and/or delay path of a plurality of the representative circuits. The one or more processors 1410 can interact with a determination module 1440. The determination module 1440 can evaluate results from the simulation module 1430. The determination module can analyze delay paths and/or simulated completion times, and identify the representative circuit with the longest delay path and/or simulated completion time. In some embodiments, the determination module 1440 selects multiple representative circuits. This can occur when multiple representative circuits have a similar delay path and/or simulated completion time. The one or more processors 1410 can interact with an incorporation module 1450 to include the one or more representative circuits identified by the determination module into the first level timing circuit of a cluster.

The simulation module 1430 can include multiple simulations to simulate a completion time range. In some embodiments, electrical properties are varied and multiple simulations of each representative circuit are performed. For example, the voltage threshold of transistors within a representative circuit can be set to a low end of a range, and a first simulation can be performed. Then, the voltage threshold of transistors within that representative circuit can be set to a high end of a range, and a second simulation can be performed. Other factors can also be simulated such as ambient temperature ranges, supply voltage ranges, and so on. As a result of the various simulations, a minimum completion time Cmin and a maximum completion time Cmax may be recorded. Thus, the completion time of a representative circuit may be represented as a pair (Cmin and Cmax). In some embodiments, the determination module 1440 analyzes the completion time range spanning from Cmin to Cmax of each representative circuit. If another representative circuit has a completion time range overlapping the completion time range of the slowest circuit, then the determination module 1440 may designate both representative circuits to be incorporated into the timing circuit of the cluster by incorporation module 1450. While modern simulation results can be quite accurate, in practice, there can still be differences in actual completion times of a circuit as compared with its simulated completion times. Therefore, some disclosed embodiments include multiple representative circuits, so that the circuit that is actually the slowest determines the assertion of the cluster's synchronization signal. Furthermore, process conditions such as diffusion of dopants, thickness of dielectric layers, and resistance of metallization layers can impact transistor switching times. By incorporating representative circuits into the timing circuits of the clusters, these variations are accounted for in the self-generated hum frequency that clocks the clusters within a fabric.

In yet other embodiments, multiple representative circuits can be incorporated by incorporation module 1450, even if they do not have overlapping completion times. In some embodiments, if the simulated completion times are within a predetermined duration of each other, they can both be incorporated by incorporation module 1450. In some embodiments, a percentage of the slowest completion time is used to form an inclusion range.

Incorporating additional representative circuits results in additional logic gates within a cluster, which can increase cost and power consumption. Therefore, in some cases, it is desirable to limit the number of representative circuits used in a first level timing circuit. In some embodiments, if the incorporation module 1450 attempts to incorporate a number of representative circuits that exceeds a predetermined threshold, a warning may be rendered on display 1414. The warning gives the chip designer an opportunity to reevaluate the design of the cluster. In some embodiments, one or more representative circuits may be modified to intentionally increase the delay path and/or completion time to reduce the number of representative circuits that are included in a first level timing circuit. In some embodiments, the representative circuits 1420 may include multiple instances of circuits with similar functionality, where some of the instances have delay paths and/or completion times that are intentionally increased. For example, additional buffer logic gates may be added to some of the instances. Thus, each of the instances performs the same function (e.g. adder, comparator, etc.) yet with a different completion time. In such an embodiment, if the incorporation module attempts to incorporate a number that exceeds a predetermined threshold, then one or more representative circuits may be replaced with an instance that has a longer delay path and/or completion time. By doing this, it reduces the number of representative circuits that are close in timing, thus reducing the number of representative circuits needed. The tradeoff of this technique is that the functional versions of the representative circuit are also replaced with the slower version, and hence, the overall clock operation may be slower. However, in certain instances, design factors such as cost and power consumption may outweigh the negative effect of a slower clock speed.

In some embodiments, a test version of a cluster may be built and used in a circuit. The test version of the cluster can include multiple representative circuits. For example, the test version of the cluster may include ten representative circuits. Once the test version of the cluster is fabricated and used in a circuit, the circuit may then be tested under a variety of operating conditions. The operating conditions may include different temperatures such as 0 degrees Celsius, 25 degrees Celsius, and 100 degrees Celsius. Other operating conditions may include fluctuation in power supply voltage and/or current, and injection of noise into the system. After the testing is complete, design engineers may examine the timing statistics register to determine which representative circuits were the critical circuit, and how often. If a designer determines that four out of the ten circuits in the test version of the cluster never were the critical circuit under any of the testing conditions, then those representative circuits may be removed from the next revision of the cluster. Thus, by using real world results of the timing of the representative circuits, design choices can be made in subsequent versions of the cluster to reduce gate count, thus reducing power consumption and complexity of the cluster.

The system 1400 can include a computer program product embodied in a non-transitory computer readable medium for implementation of a logical calculation apparatus where the computer program product can include: code for obtaining a description of a plurality of representative logic circuits, code for simulating the plurality of representative logic circuits, code for determining a first representative circuit that is a longest delay path from the plurality of representative logic circuits, and code for incorporating the longest delay path from the plurality of representative logic circuits as a timing circuit to generate a synchronization signal used in a hum fabric.

Each of the above methods may be executed on one or more processors on one or more computer systems. Embodiments may include various forms of distributed computing, client/server computing, and cloud based computing. Further, it will be understood that the depicted steps or boxes contained in this disclosure's flow charts are solely illustrative and explanatory. The steps may be modified, omitted, repeated, or re-ordered without departing from the scope of this disclosure. Further, each step may contain one or more sub-steps. While the foregoing drawings and description set forth functional aspects of the disclosed systems, no particular implementation or arrangement of software and/or hardware should be inferred from these descriptions unless explicitly stated or otherwise clear from the context. All such arrangements of software and/or hardware are intended to fall within the scope of this disclosure.

The block diagrams and flowchart illustrations depict methods, apparatus, systems, and computer program products. The elements and combinations of elements in the block diagrams and flow diagrams, show functions, steps, or groups of steps of the methods, apparatus, systems, computer program products and/or computer-implemented methods. Any and all such functions—generally referred to herein as a "circuit," "module," or "system"—may be implemented by computer program instructions, by special-purpose hardware-based computer systems, by combinations of special purpose hardware and computer instructions, by combinations of general purpose hardware and computer instructions, and so on.

A programmable apparatus which executes any of the above mentioned computer program products or computer-implemented methods may include one or more microprocessors, microcontrollers, embedded microcontrollers, programmable digital signal processors, programmable devices, programmable gate arrays, programmable array logic, memory devices, application specific integrated circuits, or the like. Each may be suitably employed or configured to process computer program instructions, execute computer logic, store computer data, and so on.

It will be understood that a computer may include a computer program product from a computer-readable storage medium and that this medium may be internal or external, removable and replaceable, or fixed. In addition, a computer may include a Basic Input/Output System (BIOS), firmware, an operating system, a database, or the like that may include, interface with, or support the software and hardware described herein.

Embodiments of the present invention are neither limited to conventional computer applications nor the programmable apparatus that run them. To illustrate: the embodiments of the presently claimed invention could include an optical computer, quantum computer, analog computer, or the like. A computer program may be loaded onto a computer to produce a particular machine that may perform any and all of the depicted functions. This particular machine provides a means for carrying out any and all of the depicted functions.

Any combination of one or more computer readable media may be utilized including but not limited to: a non-transitory computer readable medium for storage; an electronic, magnetic, optical, electromagnetic, infrared, or semiconductor computer readable storage medium or any suitable combination of the foregoing; a portable computer diskette; a hard disk; a random access memory (RAM); a read-only memory (ROM), an erasable programmable read-only memory (EPROM, Flash, MRAM, FeRAM, or phase change memory); an optical fiber; a portable compact disc; an optical storage device; a magnetic storage device; or any suitable combination of the foregoing. In the context of this document, a computer readable storage medium may be any tangible medium that can contain or store a program for use by or in connection with an instruction execution system, apparatus, or device.

It will be appreciated that computer program instructions may include computer executable code. A variety of languages for expressing computer program instructions may include without limitation C, C++, Java, JavaScript™, ActionScript™, assembly language, Lisp, Perl, Tcl, Python, Ruby, hardware description languages, database programming languages, functional programming languages, imperative programming languages, and so on. In embodiments, computer program instructions may be stored, compiled, or interpreted to run on a computer, a programmable data processing apparatus, a heterogeneous combination of processors or processor architectures, and so on. Without limitation, embodiments of the present invention may take the form of web-based computer software, which includes client/server software, software-as-a-service, peer-to-peer software, or the like.

In embodiments, a computer may enable execution of computer program instructions including multiple programs or threads. The multiple programs or threads may be processed approximately simultaneously to enhance utilization of the processor and to facilitate substantially simultaneous functions. By way of implementation, any and all methods, program codes, program instructions, and the like described herein may be implemented in one or more threads which may in turn spawn other threads, which may themselves have priorities associated with them. In some embodiments, a computer may process these threads based on priority or other order.

Unless explicitly stated or otherwise clear from the context, the verbs "execute" and "process" may be used interchangeably to indicate execute, process, interpret, compile, assemble, link, load, or a combination of the foregoing. Therefore, embodiments that execute or process computer program instructions, computer-executable code, or the like may act upon the instructions or code in any and all of the ways described. Further, the method steps shown are intended to include any suitable method of causing one or more parties or entities to perform the steps. The parties performing a step, or portion of a step, need not be located within a particular geographic location or country boundary. For instance, if an entity located within the United States causes a method step, or portion thereof, to be performed outside of the United States then the method is considered to be performed in the United States by virtue of the causal entity.

While the invention has been disclosed in connection with preferred embodiments shown and described in detail, various modifications and improvements thereon will become apparent to those skilled in the art. Accordingly, the forgoing examples should not limit the spirit and scope of the present invention; rather it should be understood in the broadest sense allowable by law.

What is claimed is:

1. An apparatus for signal generation comprising:
    a first plurality of representative logic circuits;
    a first edge aligner combining results from the first plurality of representative logic circuits;
    a first enablement circuit that enables the first plurality of representative logic circuits;
    a first synchronization signal derived from the results from the first plurality of representative logic circuits;
    a second plurality of representative logic circuits;
    a second edge aligner combining results from the second plurality of representative logic circuits;
    a second enablement circuit that enables the second plurality of representative logic circuits;
    a second synchronization signal derived from the results from the second plurality of representative logic circuits; and
    a combined synchronization signal derived from the first synchronization signal and the second synchronization signal.

2. The apparatus of claim 1 wherein the first plurality of representative logic circuits differs from the second plurality of representative logic circuits.

3. The apparatus of claim 1 wherein the first plurality of representative logic circuits is substantially similar to the second plurality of representative logic circuits.

4. The apparatus of claim 1 further comprising a third plurality of representative logic circuits where the combined synchronization signal is further derived from a third synchronization signal derived from results from the third plurality of representative logic circuits.

5. The apparatus of claim 1 wherein the first plurality of representative logic circuits and the second plurality of representative logic circuits comprise a hum generation fabric.

6. The apparatus of claim 5 wherein the hum generation fabric provides multiple synchronization signals to functional logic circuits distributed across the hum generation fabric.

7. The apparatus of claim 6 wherein the multiple synchronization signals maintain the functional logic circuits within one tic cycle of one another.

8. The apparatus of claim 5 wherein the hum generation fabric forms a clock generation structure.

9. The apparatus of claim 1 wherein the first plurality of representative logic circuits and the second plurality of representative logic circuits comprise ring oscillators.

10. The apparatus of claim 1 further comprising an output from the first edge aligner that becomes active based on a longest delay path from the first plurality of representative logic circuits.

11. The apparatus of claim 1 wherein the first edge aligner comprises an AND gate.

12. The apparatus of claim 1 wherein the first plurality of representative logic circuits includes a comparator circuit.

13. The apparatus of claim 1 wherein the first plurality of representative logic circuits includes an adder circuit.

14. The apparatus of claim 1 wherein the first plurality of representative logic circuits includes a bit manipulation unit.

15. The apparatus of claim 1 wherein the first plurality of representative logic circuits includes a programmable logic reduction circuit.

16. The apparatus of claim 1 wherein the first plurality of representative logic circuits includes a shifter circuit.

17. The apparatus of claim 1 wherein the first plurality of representative logic circuits is reset based on the first synchronization signal.

18. The apparatus of claim 1 wherein the first plurality of representative logic circuits is reset based on the first plurality of representative logic circuits being self-resetting logic.

19. The apparatus of claim 1 wherein the first plurality of representative logic circuits includes a sequential circuit.

* * * * *